United States Patent
Revier et al.

(10) Patent No.: US 11,487,206 B2
(45) Date of Patent: Nov. 1, 2022

(54) METHODS AND APPARATUS FOR DIGITAL MATERIAL DEPOSITION ONTO SEMICONDUCTOR WAFERS

(71) Applicant: Texas Instruments Incorporated, Dallas, TX (US)

(72) Inventors: Daniel Lee Revier, Seattle, WA (US); Sean Ping Chang, Richardson, TX (US); Benjamin Stassen Cook, Los Gatos, CA (US); Scott Robert Summerfelt, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 382 days.

(21) Appl. No.: 16/729,919

(22) Filed: Dec. 30, 2019

(65) Prior Publication Data

US 2021/0200094 A1 Jul. 1, 2021

(51) Int. Cl.
*G03F 7/16* (2006.01)
*G03F 7/30* (2006.01)
(Continued)

(52) U.S. Cl.
CPC .................. *G03F 7/16* (2013.01); *G03F 7/30* (2013.01); *H01L 21/0274* (2013.01);
(Continued)

(58) Field of Classification Search
CPC ........... H01L 21/0274; H01L 21/02118; H01L 21/02282; G03F 7/095
(Continued)

(56) References Cited

U.S. PATENT DOCUMENTS

| 5,622,747 A | 4/1997 | Todd et al. |
| 5,863,619 A | 1/1999 | Hur |

(Continued)

FOREIGN PATENT DOCUMENTS

GB     2352508 A    1/2001

OTHER PUBLICATIONS

Search Report for PCT Patent Application No. PCT/US2020/066528, date of mailing of the international search report dated Apr. 1, 2021, 1 page.

(Continued)

*Primary Examiner* — Caleen O Sullivan
(74) *Attorney, Agent, or Firm* — Ray A. King; Charles A. Brill; Frank D. Cimino

(57) ABSTRACT

A microelectronic device is formed by dispensing discrete amounts of a mixture of photoresist resin and solvents from droplet-on-demand sites onto a wafer to form a first photoresist sublayer, while the wafer is at a first temperature which allows the photoresist resin to attain less than 10 percent thickness non-uniformity. The wafer moves under the droplet-on-demand sites in a first direction to form the first photoresist sublayer. A portion of the solvents in the first photoresist sublayer is removed. A second photoresist sublayer is formed on the first photoresist sublayer using the droplet-on-demand sites while the wafer is at a second temperature to attain less than 10 percent thickness non-uniformity in the combined first and second photoresist (Continued)

sublayers. The wafer moves under the droplet-on-demand sites in a second direction for the second photoresist sublayer, opposite from the first direction.

19 Claims, 21 Drawing Sheets

(51) Int. Cl.
*H01L 23/00* (2006.01)
*H01L 21/266* (2006.01)
*H01L 21/308* (2006.01)
*H01L 21/027* (2006.01)
*G03F 7/095* (2006.01)

(52) U.S. Cl.
CPC ........ *H01L 21/266* (2013.01); *H01L 21/3086* (2013.01); *H01L 24/11* (2013.01); *G03F 7/095* (2013.01)

(58) Field of Classification Search
USPC .................................. 438/782; 430/330, 327
See application file for complete search history.

(56) References Cited

U.S. PATENT DOCUMENTS

| | | | | |
|---|---|---|---|---|
| 5,985,363 A | * | 11/1999 | Shiau | .................... H01L 21/312 427/407.1 |
| 6,089,763 A | | 7/2000 | Choi et al. | |
| 6,117,486 A | * | 9/2000 | Yoshihara | ............... G03F 7/162 427/362 |
| 6,133,163 A | * | 10/2000 | Tanaka | ............. H01L 21/76826 438/782 |
| 6,890,595 B2 | * | 5/2005 | Lee | ........ G03F 7/162 438/782 |
| 2001/0001746 A1 | | 5/2001 | Chun et al. | |
| 2006/0278160 A1 | | 12/2006 | Su et al. | |
| 2007/0082499 A1 | | 4/2007 | Jung et al. | |
| 2010/0297851 A1 | | 11/2010 | Bae et al. | |

OTHER PUBLICATIONS

GB2352508A, English Machine Translation, 32 pages.

* cited by examiner

METHODS AND APPARATUS FOR DIGITAL MATERIAL DEPOSITION ONTO SEMICONDUCTOR WAFERS

FIELD

This disclosure relates to the field of microelectronic devices. More particularly, this disclosure relates to photolithography processes for forming microelectronic devices.

BACKGROUND

Photolithography processes used in semiconductor manufacturing require applying a layer of photoresist to a wafer. Commonly, the wafer is covered with a thick layer of photoresist mixed with solvent, and the wafer is rotated in a spin-coat process to sling excess photoresist and solvent off the wafer. This is a highly inefficient process, wasting most of the photoresist, which then must be disposed of, incurring additional cost. Additionally, the spin-coat process leaves photoresist over the edge of the wafer, commonly called an edge bead, which must be removed, incurring additional process steps, and cost. Other methods of applying a layer of photoresist to a wafer, such as spraying, do not provide uniform thickness of the photoresist across the wafer, limiting applicability to the semiconductor manufacturing process.

SUMMARY

The present disclosure introduces a method for forming a microelectronic device. In one implementation, the disclosed method involves forming a first photoresist sublayer on a wafer using droplet-on-demand sites while the wafer is at a first temperature range which allows photoresist in the first photoresist sublayer to flow sufficiently to attain less than 10 percent thickness non-uniformity. The first photoresist sublayer is formed while the wafer is moving relative to the droplet-on-demand sites in a first direction. A portion of solvents in the first photoresist sublayer is removed. A second photoresist sublayer is formed on the first photoresist sublayer using the droplet-on-demand sites while the wafer is at a second temperature which allows photoresist in the second photoresist sublayer to flow sufficiently to attain less than 10 percent thickness non-uniformity in the combined first and second photoresist sublayers. The second photoresist sublayer is formed while the wafer is moving relative to the droplet-on-demand sites in a second direction, opposite from the first direction. A portion of solvents in the second photoresist sublayer is removed.

DETAILED DESCRIPTION

Figure 1A:
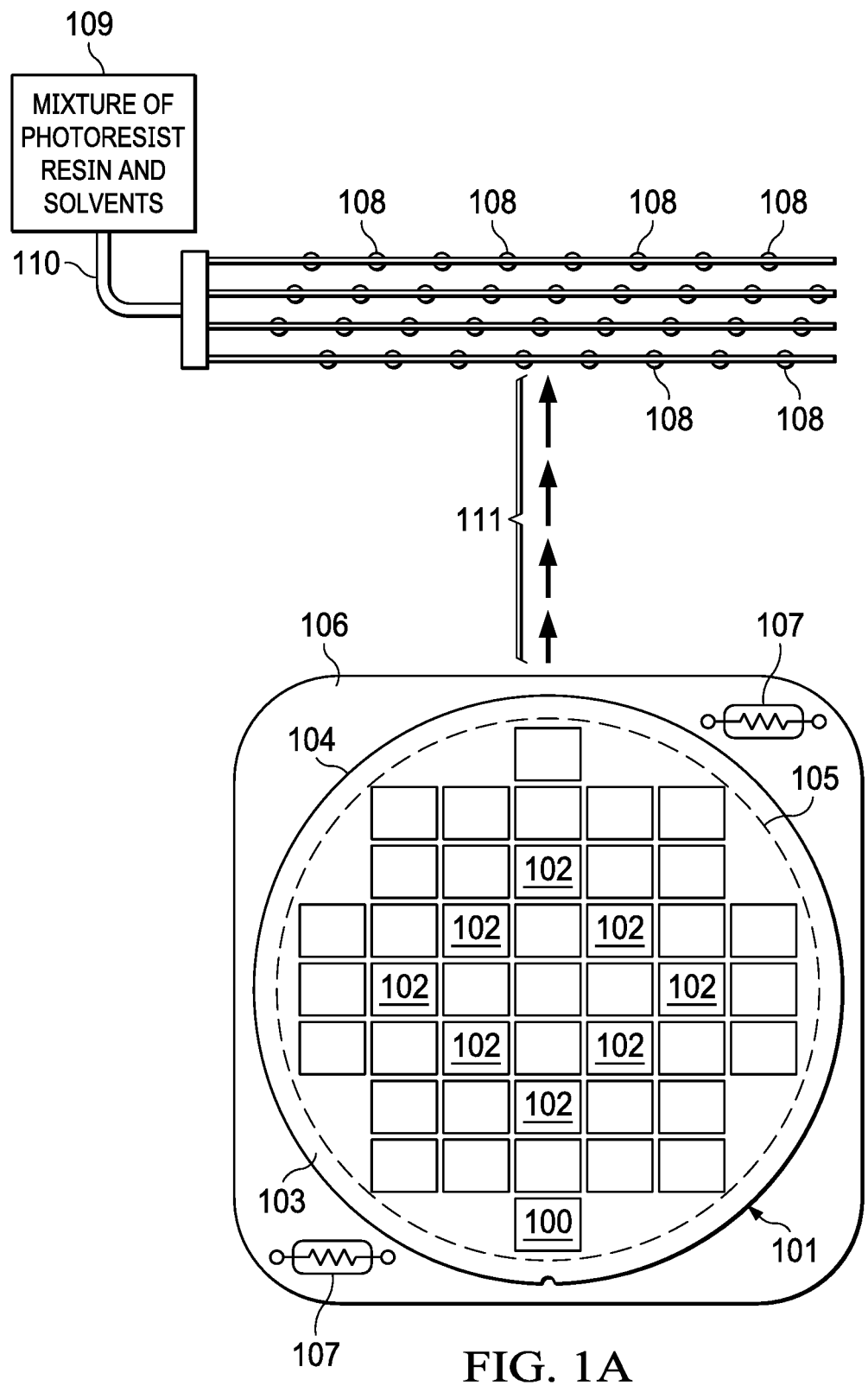
FIG. 1A through FIG. 1P depict stages of an example method of forming a microelectronic device.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device is formed by forming a photoresist layer on a wafer. The photoresist layer includes a first photoresist sublayer on the wafer, and a second photoresist sublayer on the first photoresist sublayer. The first photoresist sublayer is formed by droplet-on-demand sites. The wafer is moved relative to the droplet-on-demand sites in a first direction while the droplet-on-demand sites dispense first discrete amounts of a mixture of photoresist and solvent onto the wafer. The wafer is maintained at a first temperature range which allows photoresist resin in the first photoresist sublayer to flow sufficiently, reducing ripples and other non-planar features in the first photoresist sublayer, to attain a thickness non-uniformity of less than 10 percent, that is, a standard deviation of the thickness of the first photoresist sublayer is less than 10 percent of an average thickness of the first photoresist sublayer. Deceleration of the wafer is kept below a value sufficient to mitigate shifting of the first photoresist sublayer and so to maintain the thickness non-uniformity below 10 percent. Having the thickness non uniformity of the first photoresist sublayer below 10 percent may be considered necessary to enable a subsequent photolithographic operation using the photoresist layer. A portion of the solvents in the first photoresist sublayer are removed by evaporation before adding additional photoresist to the photoresist layer.

The second photoresist sublayer is formed by moving the wafer relative to the droplet-on-demand sites in a second direction that is opposite from the first direction, while the droplet-on-demand sites dispense second discrete amounts of the mixture of photoresist and solvent onto the first photoresist sublayer. The wafer is maintained at a second temperature which allows photoresist in the second photoresist sublayer to flow sufficiently, to attain a thickness non-uniformity of less than 10 percent in the combined first and second photoresist sublayers. Deceleration of the wafer is kept below a value sufficient to mitigate shifting of the second photoresist sublayer and so to maintain the thickness non-uniformity below than 10 percent. Having the thickness non uniformity of the second photoresist sublayer below 10 percent may also be considered necessary to enable a subsequent photolithographic operation using the photoresist layer. A portion of the solvents in the second photoresist sublayer are removed by evaporation before adding additional photoresist to the photoresist layer.

Additional photoresist sublayers may be added to the photoresist layer, by repeating the steps used to form the first and second photoresist sublayer. The photoresist layer is exposed to patterned ultraviolet (UV) light, and developed to remove the photoresist layer where exposed to the UV light, to form a patterned photoresist layer. The patterned photoresist layer is used in fabrication of the microelectronic device, for example as a plating mask, an implant mask, or an etch mask.

It is noted that terms such as over and under may be used in this disclosure. These terms should not be construed as limiting the position or orientation of a structure or element, but should be used to provide spatial relationship between structures or elements. Similarly, words such as "inward" and "outward" would refer to directions toward and away from, respectively, the center of the wafer.

Figure 1B:
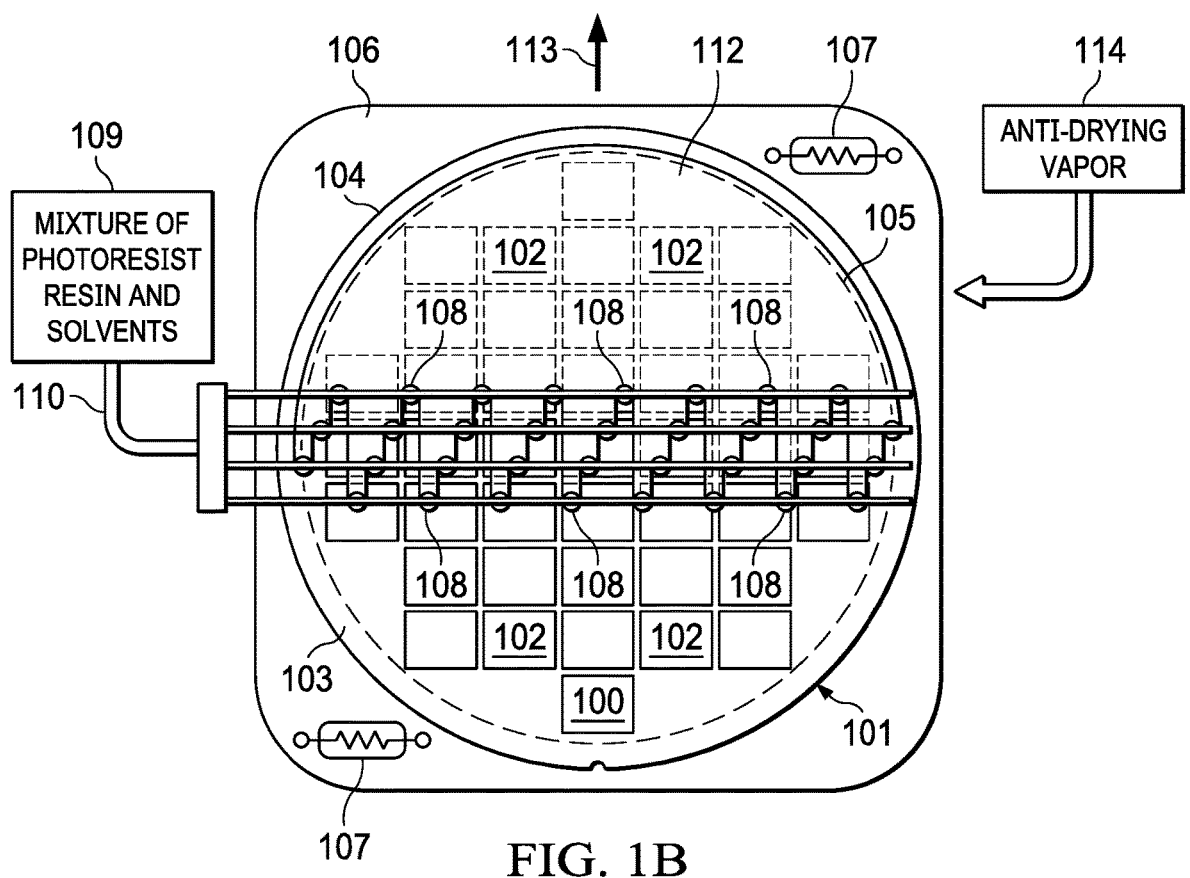
Figure 1C:
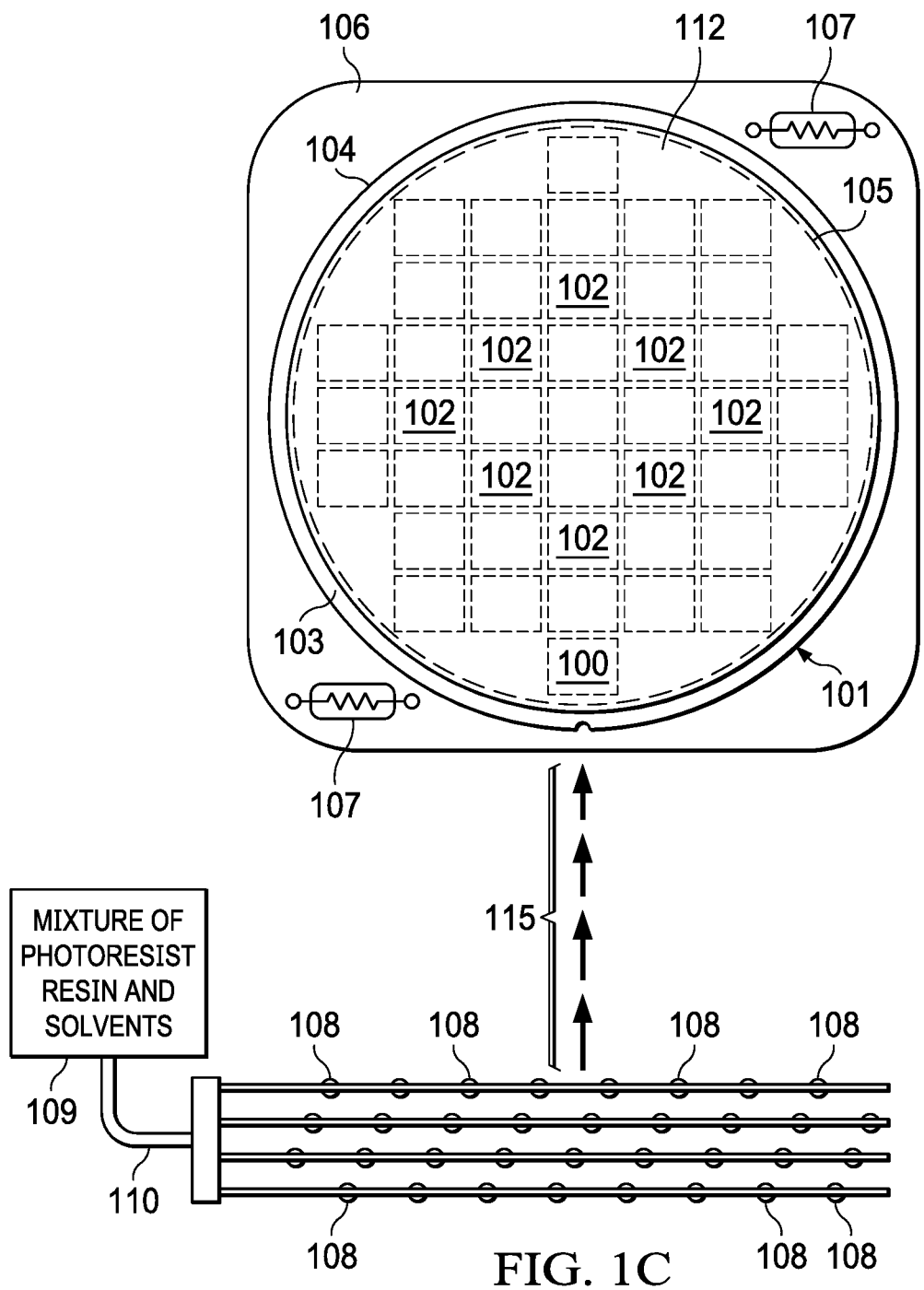
Figure 1D:
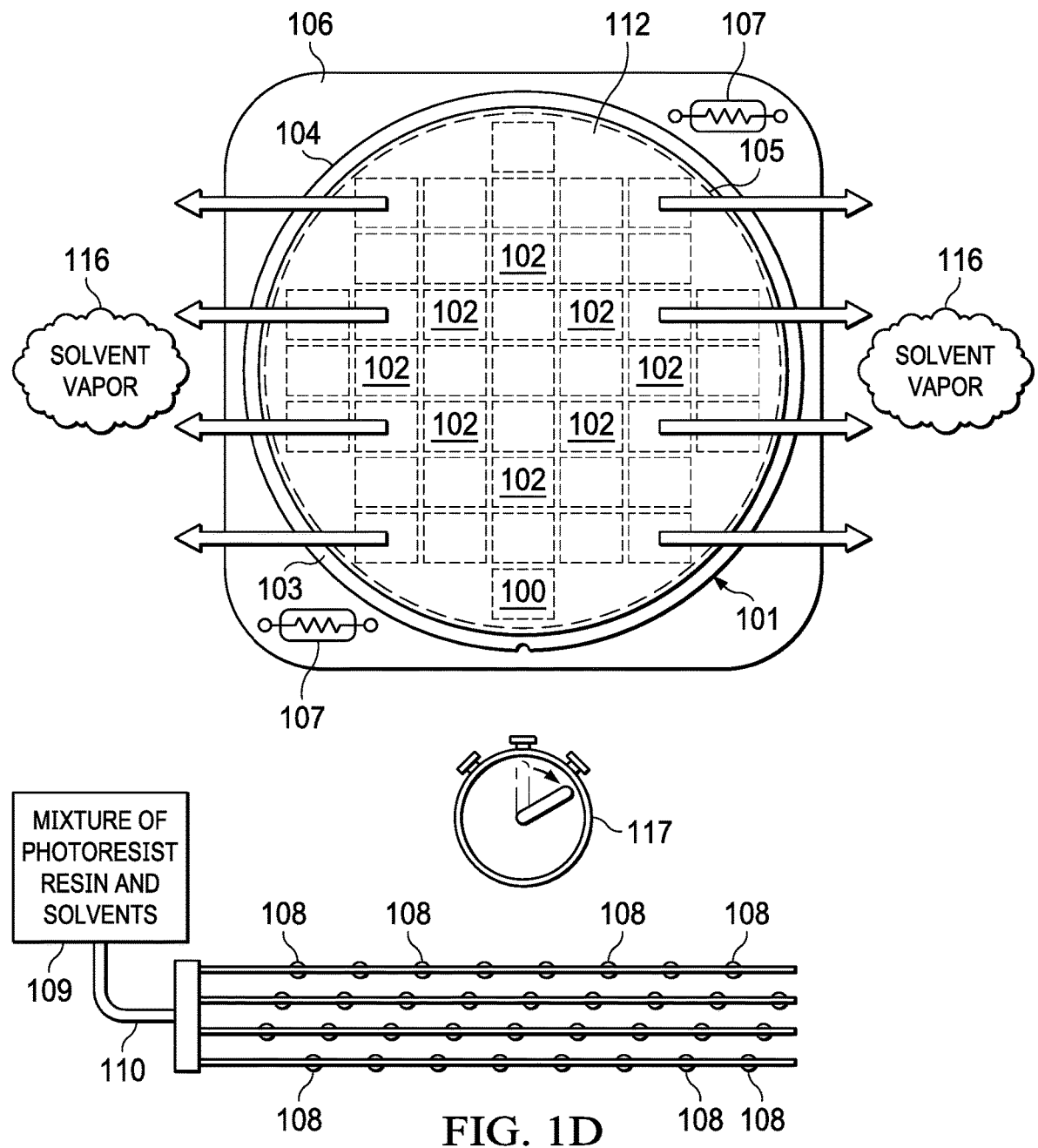
Figure 1E:
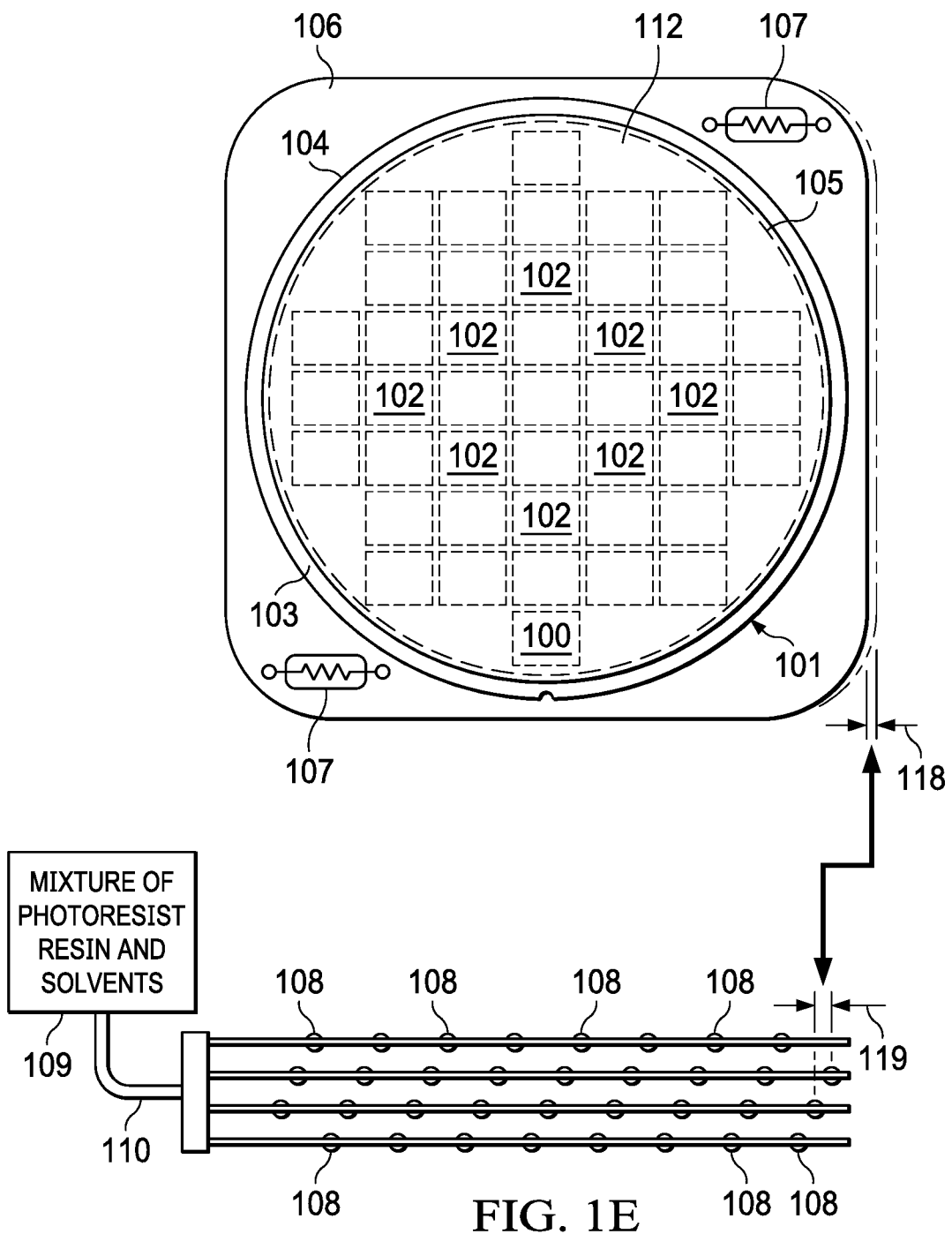
Figure 1F:
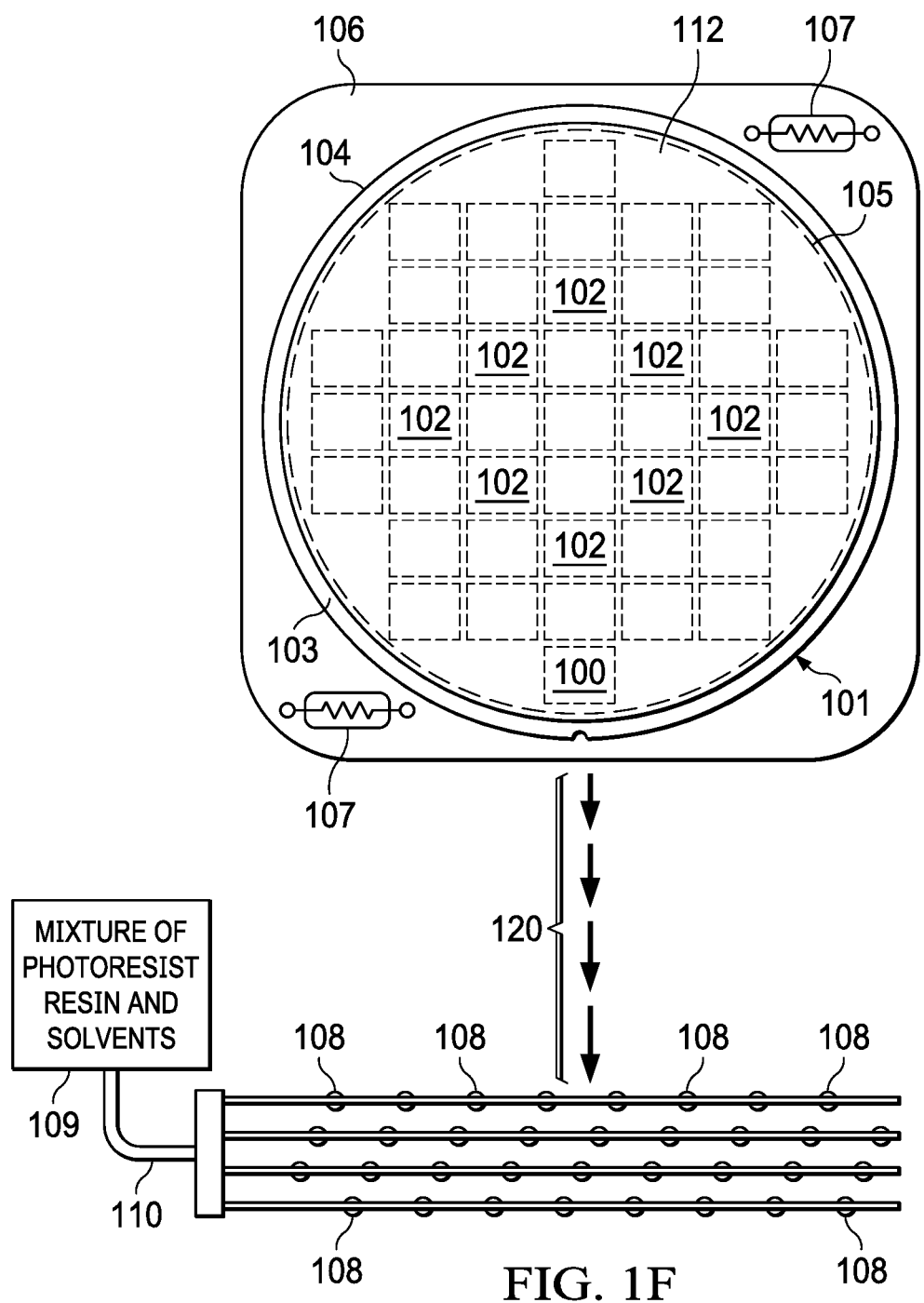
Figure 1G:
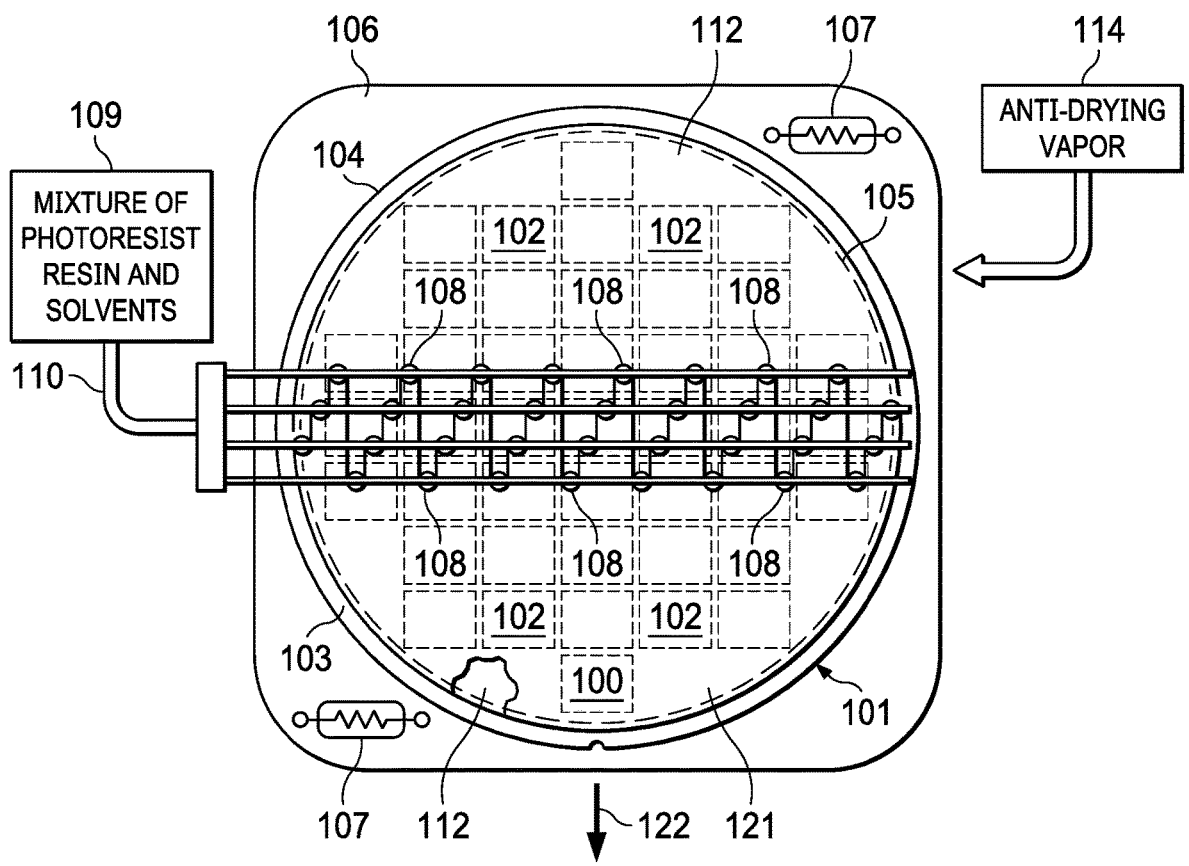
Figure 1H:
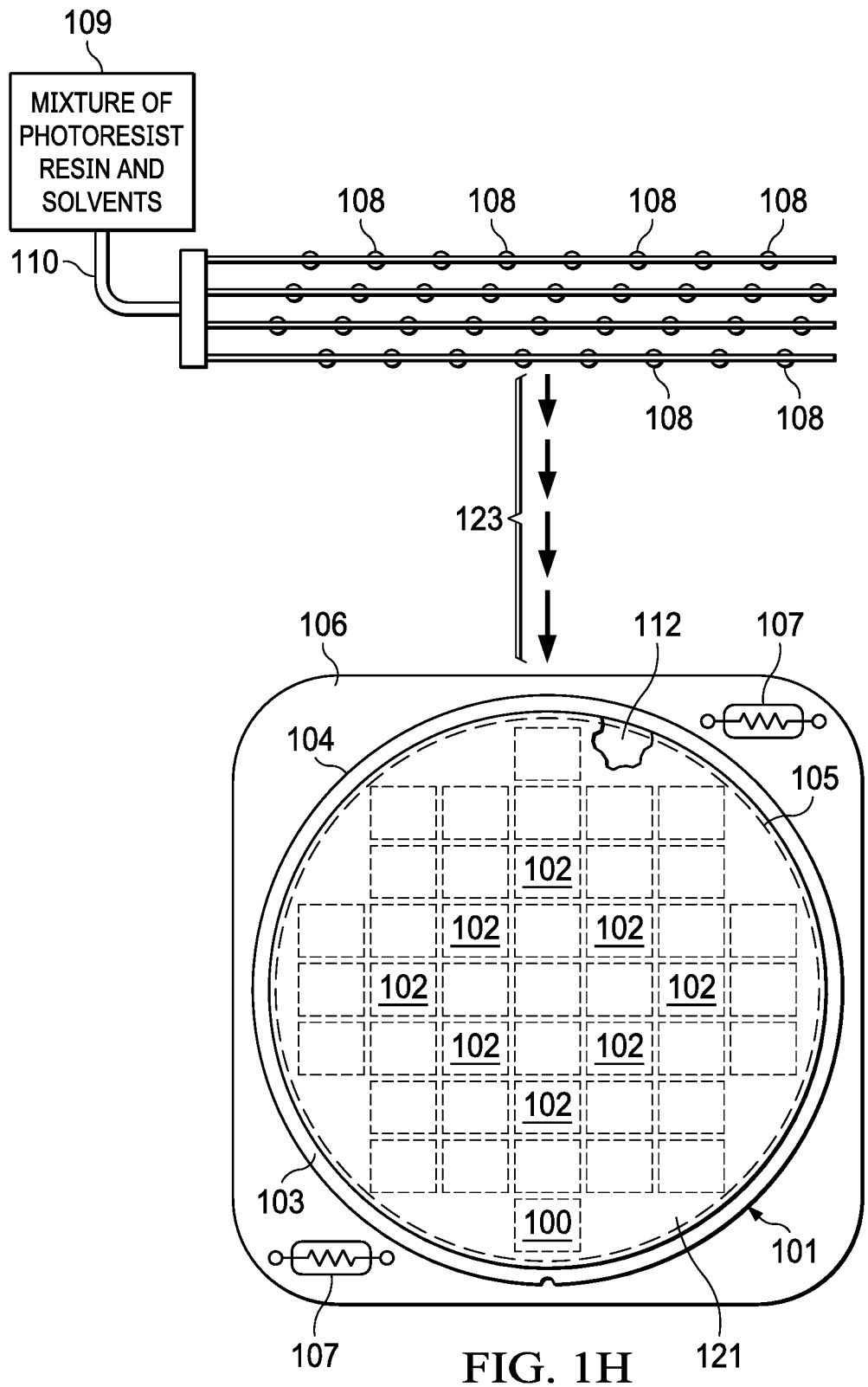
Figure 1I:
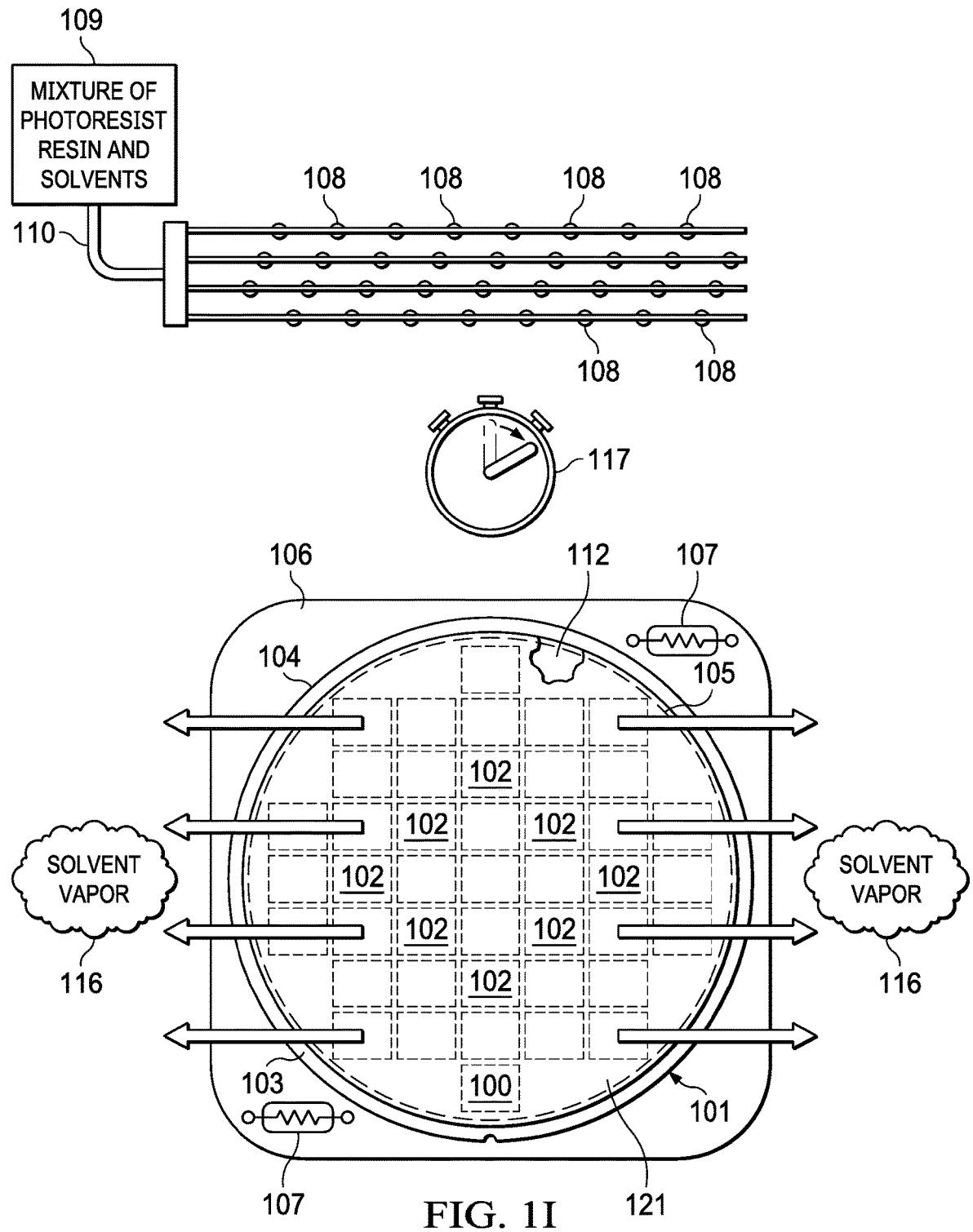
Figure 1J:
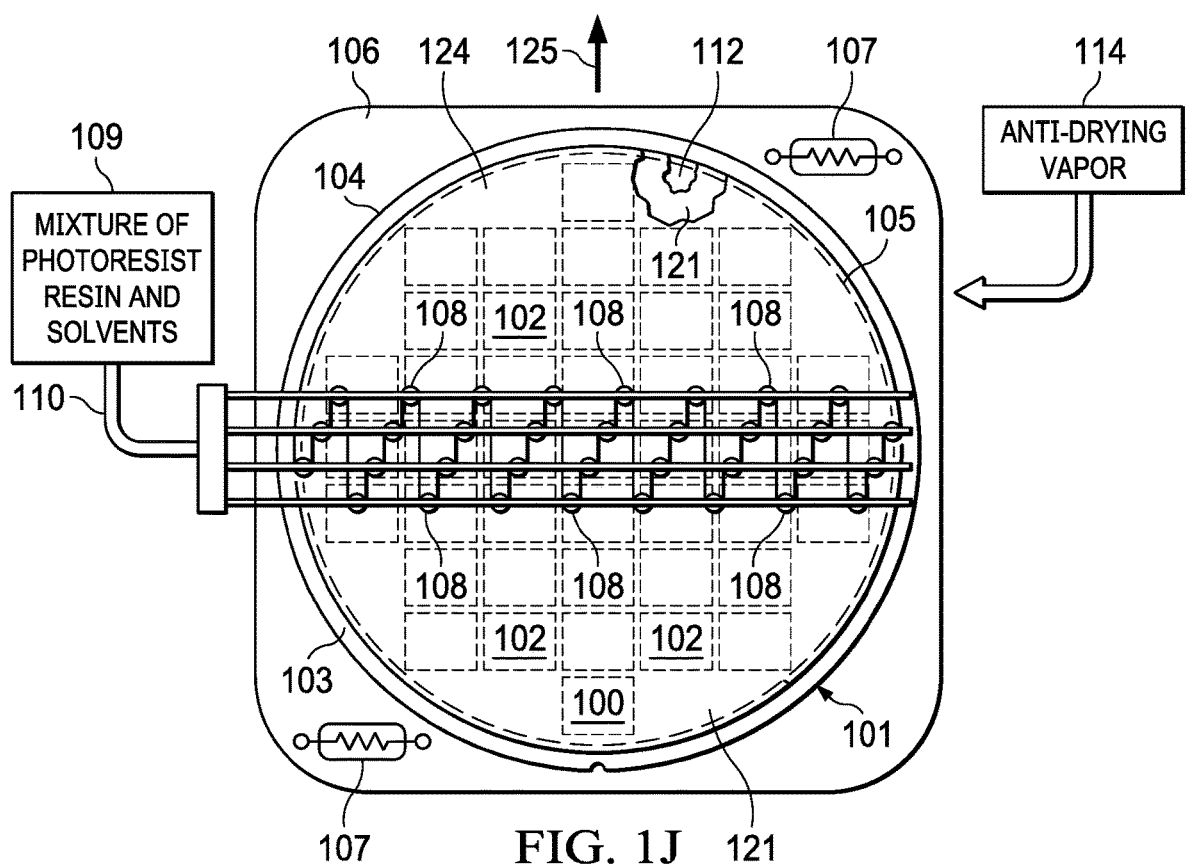
Figure 1K:
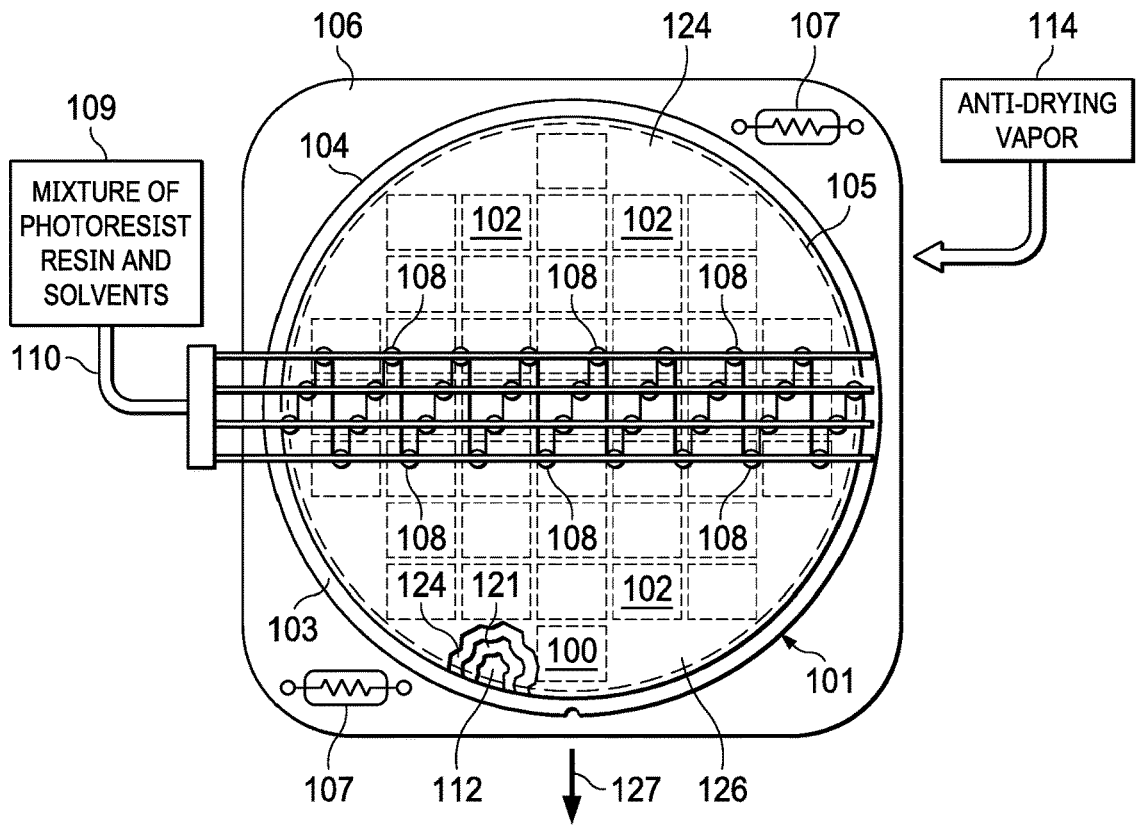
Figure 1L:
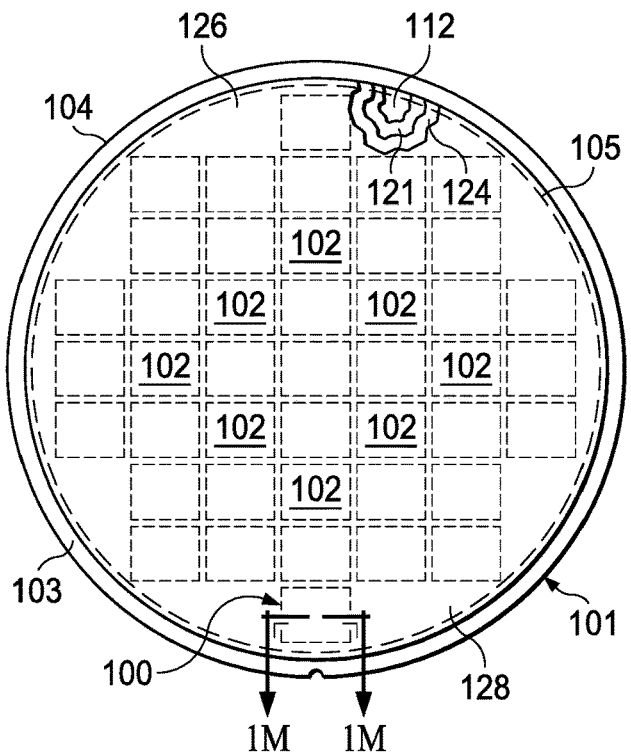
Figure 1M:
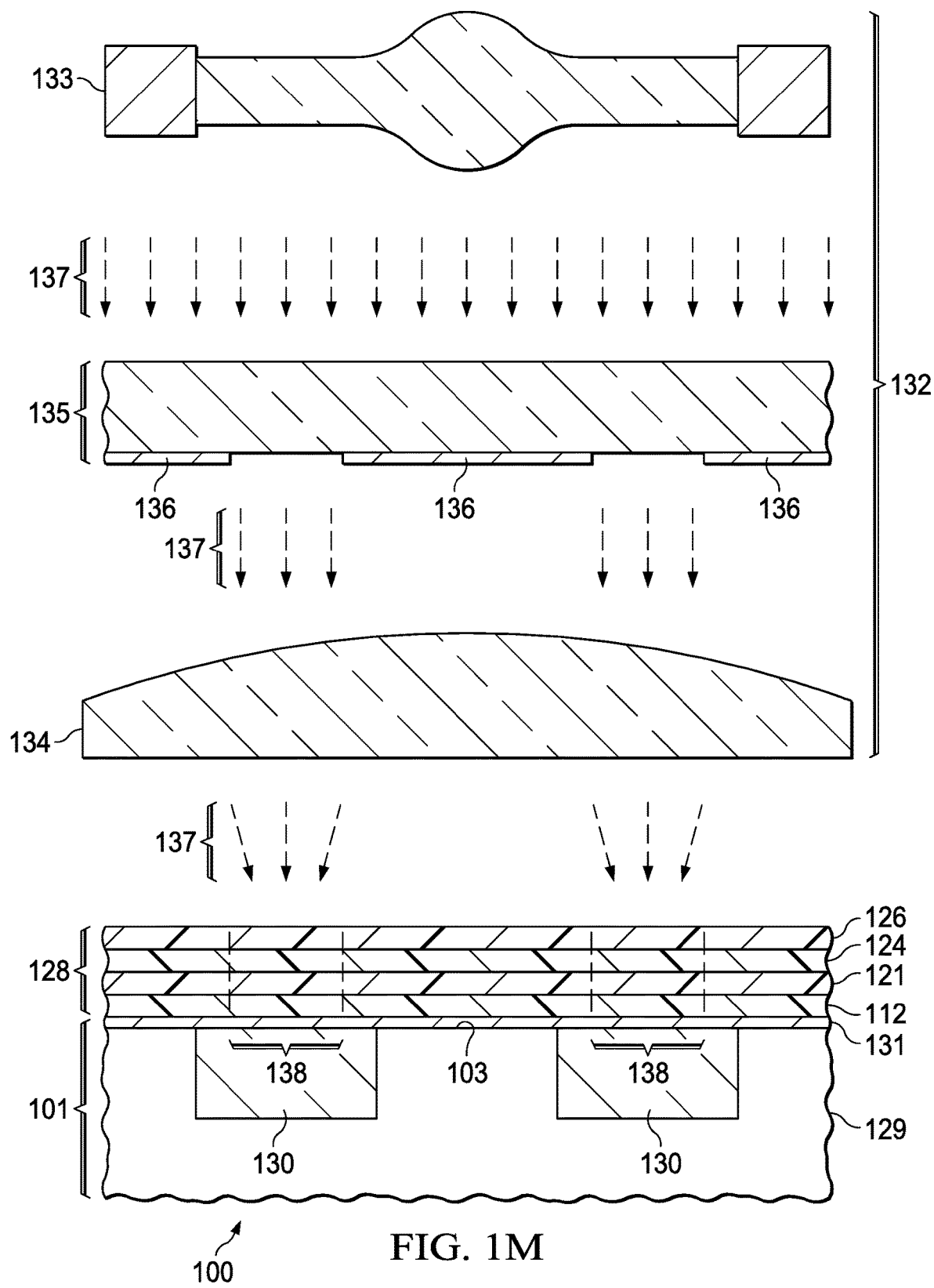
Figure 1N:
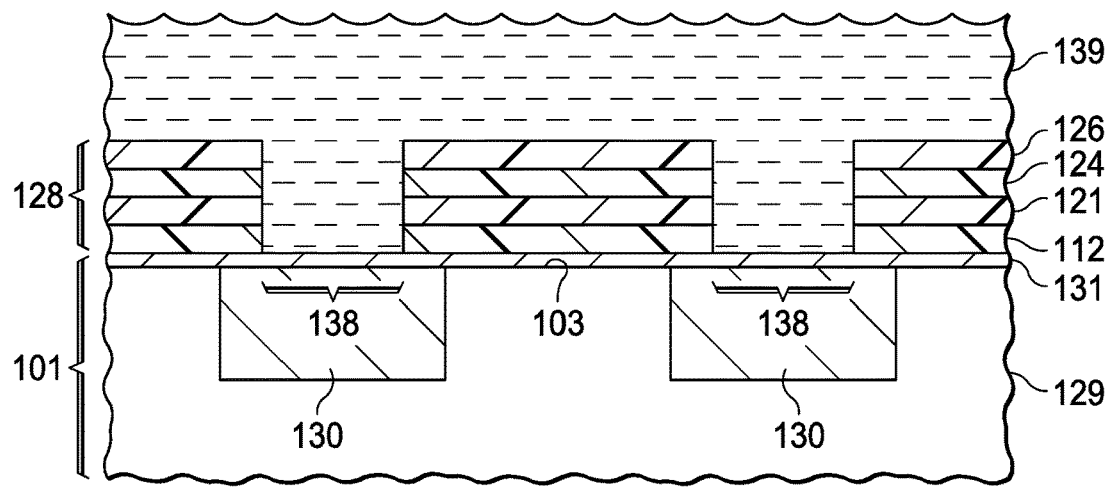
Figure 1O:
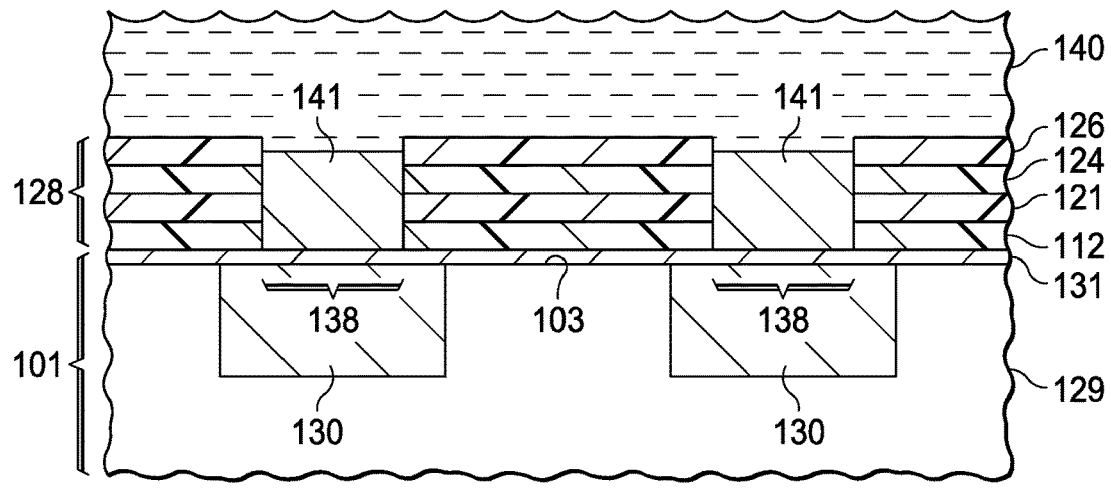
Figure 1P:
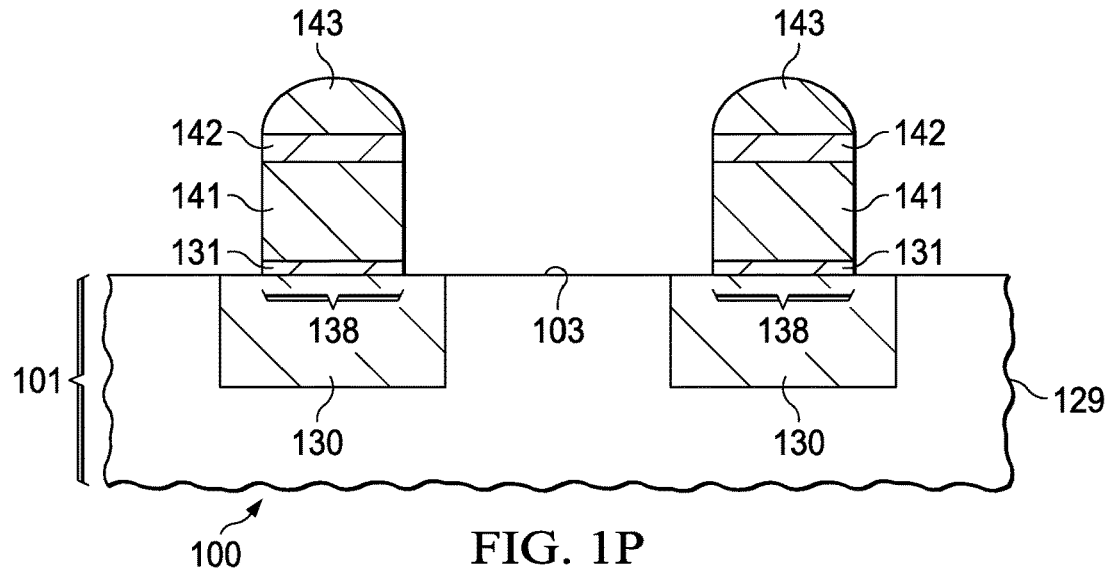

FIG. 1A through FIG. 1P depict stages of an example method of forming a microelectronic device. Referring to FIG. 1A, the microelectronic device 100 is part of a wafer 101, which may contain additional microelectronic devices 102. The microelectronic device 100 may be implemented as an integrated circuit, a discrete semiconductor device, a microelectromechanical system (MEMS) device, an electro-optical device, a micro optomechanical system device, or a microfluidics device, by way of example. The wafer 101 may be implemented as a semiconductor wafer, such as a silicon wafer, a silicon wafer with an epitaxial layer of III-V semiconductor material, a silicon on insulator (SOI) wafer, a sapphire wafer with a layer of semiconductor material, a MEMS substrate wafer, or a microfluidics substrate wafer, by way of example. The wafer 101 may have a diameter of 100 millimeters (mm), 125 mm, 150 mm, 200 mm, or 300 mm, for example. The wafer 101 has a first surface 103 which has a lateral perimeter 104 proximate to a lateral perimeter of the wafer 101. The first surface 103 is planar, or flat, apart from regular topological features which may occur in each of the microelectronic device 100 and the additional microelectronic devices 102. For the purposes of this disclosure, the terms "lateral" and "laterally" refer to directions parallel to the first surface 103, and correspondingly so in following examples. The first surface 103 does not extend onto a curved surface of the wafer 101 at the lateral perimeter of the wafer 101. In this example, a coating area 105 of the first surface 103 extends over the microelectronic device 100 and the additional microelectronic devices 102, but does not extend to the lateral perimeter 104 of the first surface 103. The coating area 105 may extend to within 1 mm to 3 mm of the lateral perimeter 104, depending on the fabrication processes used to form the microelectronic device 100.

The wafer 101 is located on a wafer holder 106. The wafer holder 106 may include, for example, aluminum or stainless steel, with vacuum ports, not shown, or mechanical clamps, not shown, to hold the wafer 101 in place. The wafer holder 106 is configured to heat the wafer 101, for example by one or more heaters 107.

The wafer holder 106 is configured to transport the wafer 101 under droplet-on-demand sites 108. The droplet-on-demand sites 108 extend across a width that is at least as wide as the coating area 105. The droplet-on-demand sites 108 are configured to dispense discrete amounts of a mixture 109 of photoresist resin and solvents. The discrete amounts of the mixture 109 of the photoresist resin and the solvents may have average volumes of 10 picoliters (pL) to 50 pL, by way of example. The mixture 109 of the photoresist resin and the solvents has a viscosity suitable for dispensing from the droplet-on-demand sites 108. The mixture 109 of the photoresist resin and the solvents may have a viscosity of 2 centipoise (cp) to 20 cp, at 20° C. to 25° C., as measured by a capillary viscometer such as an Ostwald viscometer. Furthermore, the mixture 109 of the photoresist resin and the solvents has a surface tension suitable for dispensing from the droplet-on-demand sites 108. The mixture 109 of the photoresist resin and the solvents may have a surface tension of 20 dynes/centimeter (dynes/cm) to 50 dynes/cm, at 20° C. to 25° C., as measured by a dynamic surface tension measurement method. A ratio of the surface tension to the viscosity may be maintained in a range of 50 cm/second to 500 cm/second, to provide consistent volumes of the discrete amounts of the mixture 109 of photoresist resin and solvents that are dispensed by the droplet-on-demand sites 108.

The mixture 109 of the photoresist resin and the solvents may have a photoresist resin content of 10 weight percent to 20 weight percent, with a remainder of the mixture 109 being substantially composed of solvents. For the purposes of this disclosure, the term "substantially composed of solvents" encompasses mixtures of the photoresist resin and the solvents with other materials that do not affect forming a photoresist layer and performing a photolithographic process on the photoresist layer. The mixture 109 of the photoresist resin and the solvents includes at most an insignificant amount of material other than the photoresist resin and the solvents. The photoresist resin may include novolac resin with a photoinitiator such as diazoquinone. The solvents may include two or more solvents, with concentrations of the solvents selected to provide desired values of the viscosity and the surface tension. For example, the solvents may include propylene glycol methyl ether acetate (PGMEA) and gamma butyrolactone (GBL). An example method of preparing the mixture 109 of the photoresist resin and the solvents may include mixing 100 parts of AZ P4620 photoresist having approximately 35 percent photoresist resin and 65 percent solvent (such as n-butyl acetate or xylene) with 60 parts of PGMEA and 90 parts of GBL. Other formulations of the mixture 109 of the photoresist resin and the solvents are within the scope of this example, and other methods of preparing the mixture 109 of the photoresist resin and the solvents are also within the scope of this example.

The mixture 109 of the photoresist resin and the solvents are provided to the droplet-on-demand sites 108. The mixture 109 may be provided to the droplet-on-demand sites 108 by a distribution system 110, as indicated in FIG. 1A. Alternatively, the mixture 109 may be provided to the droplet-on-demand sites 108 by adding the mixture 109 to individual reservoirs at each droplet-on-demand site 108 prior to processing the wafer 101.

The wafer 101 is heated to a temperature in a first temperature range, for example 45° C. to 50° C. The wafer holder 106 moves the wafer 101 under the droplet-on-demand sites 108. FIG. 1A depicts the wafer holder 106 starting to move the wafer 101, as indicated by the increasing speed arrows 111. The wafer holder 106 may accelerate at a rate less than 500 millimeters/second$^2$ (mm/s$^2$).

Referring to FIG. 1B, the droplet-on-demand sites 108 dispense the mixture 109 of the photoresist resin and the solvents onto the wafer 101 to form a first photoresist sublayer 112 on the wafer 101, covering the coating area 105, as the wafer holder 106 moves the wafer 101 under the droplet-on-demand sites 108. Each of the droplet-on-demand sites 108 dispenses the mixture 109 of the photoresist resin and the solvents in first discrete amounts having a first average droplet volume of 10 pL to 50 pL. Each of the droplet-on-demand sites 108 may dispense the first discrete amounts at a first average droplet frequency of 2000 droplets/second to 4000 droplets/second, for example. The first photoresist sublayer 112 is continuous, and covers the coating area 105. The wafer holder 106 may move under the droplet-on-demand sites 108 at a first constant speed, as indicated by first speed arrow 113. The first constant speed may be selected to provide a desired thickness of the first photoresist sublayer 112 while maintaining complete coverage of the coating area 105. The first constant speed may be 50 millimeters/second (mm/s) to 150 mm/sec, depending on the first average droplet volume and the first average droplet frequency. The first photoresist sublayer 112 has a first average coated thickness, which is the average thickness immediately after the first photoresist sublayer 112 is formed, of 30 microns to 50 microns, for example. The wafer 101 is maintained at a temperature in the first temperature range, which allows the photoresist resin in the first photoresist sublayer 112 to flow sufficiently after being dispensed onto the wafer 101, reducing ripples and other non-planar features in the first photoresist sublayer 112, to attain a thickness non-uniformity of less than 10 percent. If the temperature of the wafer 101 drops to a temperature less than the first temperature range, the first photoresist sublayer 112 may exhibit thickness variations, greater than 10 percent, having lateral dimensions of several centimeters over the coating area 105, as a result of insufficient flow of the photoresist resin. If the temperature of the wafer 101 increases to a temperature greater than the first temperature range, the first photoresist sublayer 112 may exhibit thickness variations, greater than 10 percent, having lateral dimensions of several millimeters over the coating area 105, as a result of rapid drying of the first photoresist sublayer 112 before the photoresist resin can flow sufficiently to even out the thickness. An upper limit and a lower limit of the first temperature range are selected to attain a thickness non uniformity of less than 10 percent in the first photoresist sublayer 112. The upper limit of 50° C. and the lower limit of 45° C. were selected to provide the desired thickness uniformity for the process parameters disclosed in this example. The upper limit and the lower limit may be adjusted to accommodate the specific mixture 109 of the photoresist resin and the solvents, the thickness of the first photoresist sublayer 112, or other process parameters. A span of the first temperature range, that is a difference between the upper limit and the lower limit, may be 3° C. to 10° C., to attain consistent uniformity in the first photoresist sublayer 112.

FIG. 1B depicts the first photoresist sublayer 112 partway through formation. Optionally, an anti-drying vapor 114 may be introduced over the wafer 101 while the droplet-on-demand sites 108 are dispensing the mixture 109 of the photoresist resin and the solvents onto the wafer 101 to form the first photoresist sublayer 112, to reduce loss of solvents from the first photoresist sublayer 112. The anti-drying vapor 114 may include, for example, chemicals that are similar to, or identical to, the solvents in the mixture 109 of the photoresist resin and the solvents, in vapor form. Loss of solvents from the first photoresist sublayer 112 while the droplet-on-demand sites 108 are dispensing the mixture 109 of the photoresist resin and the solvents onto the wafer 101 may result in thickness non-uniformity in the first photoresist sublayer 112 across the wafer, as regions of the first photoresist sublayer 112 which are formed early in the process may lose more solvents and thus be thinner than regions of the first photoresist sublayer 112 which are formed later in the process. Introducing the anti-drying vapor 114 may advantageously improve a thickness uniformity of the first photoresist sublayer 112.

Referring to FIG. 1C, the wafer holder 106 is slowed to a stop after the first photoresist sublayer 112 is formed, as indicated by the decreasing speed arrows 115. The wafer holder 106 may be slowed to a stop at a deceleration rate less than 500 mm/s$^2$, to reduce lateral shifting of the first photoresist sublayer 112. Lateral shifting of the first photoresist sublayer 112 may result in a thickness non-uniformity of the first photoresist sublayer 112 across the coating area 105 of more than a few percent, which may exceed a process latitude of a subsequent photolithographic process using the first photoresist sublayer 112.

Referring to FIG. 1D, a portion of the solvents, in the form of solvent vapor 116, is removed from the first photoresist sublayer 112. The solvent vapor 116 may be removed by passing a dry ambient of nitrogen or dry air over the first photoresist sublayer 112. The wafer 101 may be maintained at a temperature in the first temperature range, to facilitate removal of the solvents while maintaining thickness non-uniformity below 10 percent. The solvents are removed for a prescribed first drying time, as indicated schematically by the stopwatch 117; the first drying time may be 1 second to 10 seconds, by way of example. Between 10 weight percent and 75 weight percent of the solvents in the first photoresist sublayer 112 may be removed during the first drying time, by way of example. Removing less than 10 weight percent of the solvents from the first photoresist sublayer 112 may require excess drying time after additional sublayers of the mixture 109 of photoresist and solvents are formed on the first photoresist sublayer 112. Removing more than 75 weight percent of the solvents from the first photoresist sublayer 112 may result in poor adhesion of an additional sublayer of the mixture 109 of photoresist and solvents formed on the first photoresist sublayer 112. The thickness of the first photoresist sublayer 112 may decrease according to the amount of solvents removed during the first drying time.

Referring to FIG. 1E, the wafer holder 106 may move the wafer 101 laterally by a first lateral distance 118 which is less than a lateral separation 119 between adjacent droplet-on-demand sites 108. For the purposes of this disclosure, the term "lateral" refers to a direction parallel to the first surface 103 of the wafer 101. The first lateral distance 118 and the lateral separation 119 are perpendicular to the direction of movement of the wafer 101 and the wafer holder 106 under the droplet-on-demand sites 108. The wafer holder 106 may move the wafer 101 laterally by the first lateral distance 118 prior to forming an additional sublayer of the mixture 109 of photoresist and solvents on the wafer 101, to improve a thickness uniformity of the combined sublayers.

Referring to FIG. 1F, the wafer 101 is heated to a temperature in a second temperature range, which may be identical to the first temperature range. The wafer holder 106 moves the wafer 101 under the droplet-on-demand sites 108. FIG. 1F depicts the wafer holder 106 starting to move the wafer 101, as indicated by the increasing speed arrows 120. Removing the portion of the solvents from the first photoresist sublayer 112 may reduce shifting of the first photoresist sublayer 112 during acceleration or deceleration, so that the wafer holder 106 may accelerate at a rate greater than the deceleration rate disclosed in reference to FIG. 1C after the first photoresist sublayer 112 was formed, before the portion of the solvents was removed.

Referring to FIG. 1G, the droplet-on-demand sites 108 dispense the mixture 109 of the photoresist resin and the solvents onto the wafer 101 to form a second photoresist sublayer 121 on the first photoresist sublayer 112, covering the coating area 105, as the wafer holder 106 moves the wafer 101 under the droplet-on-demand sites 108. Each of the droplet-on-demand sites 108 dispenses the mixture 109 of the photoresist resin and the solvents in second discrete amounts having a second average droplet volume of 10 pL to 50 pL. The second discrete amounts may have volumes equal to the volumes of the first discrete amounts. Each of the droplet-on-demand sites 108 may dispense the second discrete amounts at a second average droplet frequency of 2000 droplets/second to 4000 droplets/second, for example. The second average droplet frequency may be equal to the first average droplet frequency. The second photoresist sublayer 121 is continuous, and covers the coating area 105. The wafer holder 106 may move under the droplet-on-demand sites 108 at a second constant speed, as indicated by second speed arrow 122. The second constant speed may be selected to provide a desired thickness of the second photoresist sublayer 121 while maintaining complete coverage of the coating area 105. The second constant speed may be 50 mm/s to 150 mm/sec, depending on the second average droplet volume and the second average droplet frequency. The second constant speed may be equal to the first constant speed. The second photoresist sublayer 121 has a second average coated thickness, which is the average thickness immediately after the second photoresist sublayer 121 is formed, of 30 microns to 50 microns, for example. The wafer 101 is maintained at a temperature in the second temperature range, which allows the photoresist resin in the second photoresist sublayer 121 to flow sufficiently after being dispensed onto the first photoresist sublayer 112, reducing ripples and other non-planar features in the second photoresist sublayer 121, to attain a thickness non-uniformity of less than 10 percent. FIG. 1G depicts the second photoresist sublayer 121 partway through formation. Optionally, the anti-drying vapor 114 may be introduced over the wafer 101 while the droplet-on-demand sites 108 are dispensing the mixture 109 of the photoresist resin and the solvents onto the wafer 101 to form the second photoresist sublayer 121, to reduce loss of solvents from the second photoresist sublayer 121, accruing the benefit disclosed in reference to FIG. 1B.

Referring to FIG. 1H, the wafer holder 106 is slowed to a stop after the second photoresist sublayer 121 is formed, as indicated by the decreasing speed arrows 123. The wafer holder 106 may be slowed to a stop at a deceleration rate less than 500 mm/s$^2$, to reduce lateral shifting of the second photoresist sublayer 121, as the second photoresist sublayer 121 may be prone to shifting during deceleration, similar to the tendency of the first photoresist sublayer 112 to shift, as disclosed in reference to FIG. 1C.

Referring to FIG. 1I, a portion of the solvents, in the form of solvent vapor 116, is removed from the second photoresist sublayer 121. The solvent vapor 116 may be removed by a similar method used to remove the solvent vapor 116 from the first photoresist sublayer 112, as disclosed in reference to FIG. 1E. The wafer 101 may be maintained at a temperature in the second temperature range, to facilitate removal of the solvents while maintaining thickness non-uniformity below 10 percent. The solvents are removed for a prescribed second drying time, as indicated schematically by the stopwatch 117; the second drying time may be 1 second to 10 seconds, by way of example, and may be equal to the first drying time, discussed in reference to FIG. 1E. Between 10 weight percent and 75 weight percent of the solvents in the second photoresist sublayer 121 may be removed during the second drying time, by way of example. Removing less than 10 weight percent of the solvents from the second photoresist sublayer 121 may require excess drying time after additional sublayers of the mixture 109 of photoresist and solvents are formed on the second photoresist sublayer 121. Removing more than 75 weight percent of the solvents from the second photoresist sublayer 121 may result in poor adhesion of an additional sublayer of the mixture 109 of photoresist and solvents formed on the second photoresist sublayer 121. The thickness of the second photoresist sublayer 121 may decrease according to the amount of solvents removed during the second drying time.

Referring to FIG. 1J, a third photoresist sublayer 124 may optionally be formed on the second photoresist sublayer 121. The wafer holder 106 may be moved laterally by a lateral distance, not shown, which is less than the lateral separation 119 of FIG. 1E between adjacent droplet-on-demand sites 108. The wafer holder 106 may be moved to locate the wafer 101 in a same position with respect to the droplet-on-demand sites 108 as shown in FIG. 1A. The wafer holder 106 may be moved laterally prior to forming an additional sublayer of the mixture 109 of photoresist and solvents on the wafer 101, to improve a thickness uniformity of the combined sublayers.

The wafer 101 may be heated to a temperature in a third temperature range, which may be identical to the first temperature range or to the second temperature range. The wafer holder 106 moves the wafer 101 under the droplet-on-demand sites 108, for example, as disclosed in reference to FIG. 1F. Removing the portion of the solvents from the second photoresist sublayer 121 may reduce shifting of the second photoresist sublayer 121 during acceleration or deceleration, so that the wafer holder 106 may accelerate at a rate greater than the deceleration rates disclosed in reference to FIG. 1C and FIG. 1H after the first photoresist sublayer 112 and the second photoresist sublayer 121, respectively, were formed, and before the portions of the solvents were removed as disclosed in reference to FIG. 1D and FIG. 1I.

The droplet-on-demand sites 108 may dispense the mixture 109 of the photoresist resin and the solvents onto the wafer 101 to form the third photoresist sublayer 124 on the second photoresist sublayer 121, covering the coating area 105, as the wafer holder 106 moves the wafer 101 under the droplet-on-demand sites 108. Each of the droplet-on-demand sites 108 dispenses the mixture 109 of the photoresist resin and the solvents in third discrete amounts having a third average droplet volume of 10 pL to 50 pL. The third discrete amounts may have volumes equal to the volumes of the first discrete amounts or the second discrete amounts. Each of the droplet-on-demand sites 108 may dispense the third discrete amounts at a third average droplet frequency of 2000 droplets/second to 4000 droplets/second, for example. The third average droplet frequency may be equal to the first average droplet frequency or the second average droplet frequency. The third photoresist sublayer 124 is continuous, and covers the coating area 105. The wafer holder 106 may move under the droplet-on-demand sites 108 at a third constant speed, as indicated by third speed arrow 125. The third constant speed may be selected to provide a desired thickness of the third photoresist sublayer 124 while maintaining complete coverage of the coating area 105. The third constant speed may be 50 mm/s to 150 mm/sec, depending on the third average droplet volume and the third average droplet frequency. The third constant speed may be equal to the first constant speed or the second constant speed. The third photoresist sublayer 124 has a third average coated thickness, which is the average thickness immediately after the third photoresist sublayer 124 is formed, of 30 microns to 50 microns, for example. The wafer 101 is maintained at the temperature in the third temperature range, to attain a thickness non-uniformity of less than 10 percent, as disclosed in reference to the first photoresist sublayer 112 and the second photoresist sublayer 121. FIG. 1J depicts the third photoresist sublayer 124 partway through formation. Optionally, the anti-drying vapor 114 may be introduced over the wafer 101 while the droplet-on-demand sites 108 are dispensing the mixture 109 of the photoresist resin and the solvents onto the wafer 101 to form the third photoresist sublayer 124, to reduce loss of solvents from the third photoresist sublayer 124, accruing the benefit disclosed in reference to FIG. 1B. After the third photoresist sublayer 124 is formed, the wafer holder 106 may be decelerated as disclosed in reference to FIG. 1C and FIG. 1H. A portion of the solvents in the third photoresist sublayer 124 is removed, as disclosed in reference to FIG. 1D and FIG. 1I.

Referring to FIG. 1K, a fourth photoresist sublayer 126 may optionally be formed on the third photoresist sublayer 124. The wafer holder 106 may be moved laterally by a lateral distance, not shown, which is less than the lateral separation 119 of FIG. 1E between adjacent droplet-on-demand sites 108. The wafer holder 106 may be moved to locate the wafer 101 in a same position with respect to the droplet-on-demand sites 108 as shown in FIG. 1E. The wafer holder 106 may be moved laterally prior to forming an additional sublayer of the mixture 109 of photoresist and solvents on the wafer 101, to improve a thickness uniformity of the combined sublayers.

The wafer 101 may be heated to a temperature in a fourth temperature range, which may be identical to the first temperature range, the second temperature range, or the third temperature range. The wafer holder 106 moves the wafer 101 under the droplet-on-demand sites 108, for example, as disclosed in reference to FIG. 1F. Removing the portion of the solvents from the third photoresist sublayer 124 may reduce shifting of the third photoresist sublayer 124 during acceleration or deceleration, so that the wafer holder 106 may accelerate at a rate greater than the deceleration rates disclosed in reference to FIG. 1C and FIG. 1H after the first photoresist sublayer 112 and the second photoresist sublayer 121, respectively, were formed.

The droplet-on-demand sites 108 dispense the mixture 109 of the photoresist resin and the solvents onto the wafer 101 to form the fourth photoresist sublayer 126 on the third photoresist sublayer 124, covering the coating area 105, as the wafer holder 106 moves the wafer 101 under the droplet-on-demand sites 108. Each of the droplet-on-demand sites 108 dispenses the mixture 109 of the photoresist resin and the solvents in fourth discrete amounts having a fourth average droplet volume of 10 pL to 50 pL. The fourth discrete amounts may have volumes equal to the volumes of the first discrete amounts, the second discrete amounts, or the third discrete amounts. Each of the droplet-on-demand sites 108 may dispense the fourth discrete amounts at a fourth average droplet frequency of 2000 droplets/second to 4000 droplets/second, for example. The fourth average droplet frequency may be equal to the first average droplet frequency, the second average droplet frequency, or the third average droplet frequency. The fourth photoresist sublayer 126 is continuous, and covers the coating area 105. The wafer holder 106 may move under the droplet-on-demand sites 108 at a fourth constant speed, as indicated by fourth speed arrow 127. The fourth constant speed may be selected to provide a desired thickness of the fourth photoresist sublayer 126 while maintaining complete coverage of the coating area 105. The fourth constant speed may be 50 mm/s to 150 mm/sec, depending on the fourth average droplet volume and the fourth average droplet frequency. The fourth constant speed may be equal to the first constant speed, the second constant speed, or the third constant speed. The fourth photoresist sublayer 126 has a fourth average coated thickness, which is the average thickness immediately after the fourth photoresist sublayer 126 is formed, of 30 microns to 50 microns, for example. The wafer 101 is maintained at the temperature in the fourth temperature range, to attain a thickness non-uniformity of less than 10 percent, as disclosed in reference to the first photoresist sublayer 112 and the second photoresist sublayer 121. FIG. 1K depicts the fourth photoresist sublayer 126 partway through formation. Optionally, the anti-drying vapor 114 may be introduced over the wafer 101 while the droplet-on-demand sites 108 are dispensing the mixture 109 of the photoresist resin and the solvents onto the wafer 101 to form the fourth photoresist sublayer 126, to reduce loss of solvents from the fourth photoresist sublayer 126, accruing the benefit disclosed in reference to FIG. 1B. After the fourth photoresist sublayer 126 is formed, the wafer holder 106 may be decelerated as disclosed in reference to FIG. 1C and FIG. 1H. A portion of the solvents in the fourth photoresist sublayer 126 may be removed, as disclosed in reference to FIG. 1D and FIG. 1I.

FIG. 1L depicts the wafer 101 after the first photoresist sublayer 112, the second photoresist sublayer 121, the third photoresist sublayer 124, and the fourth photoresist sublayer 126 are formed. The first photoresist sublayer 112, the second photoresist sublayer 121, the third photoresist sublayer 124, and the fourth photoresist sublayer 126 provide at least a portion of a photoresist layer 128 on the first surface 103 of the wafer 101. The photoresist layer 128 covers the coating area 105, but does not extend to the lateral perimeter 104 of the first surface 103. The photoresist layer 128 may include additional photoresist sublayers, not shown, in addition to the first photoresist sublayer 112, the second photoresist sublayer 121, the third photoresist sublayer 124, and the fourth photoresist sublayer 126. The additional photoresist sublayers may be formed as disclosed in reference to the first photoresist sublayer 112, the second photoresist sublayer 121, the third photoresist sublayer 124, or the fourth photoresist sublayer 126. Forming the photoresist layer 128 by the method of this example may advantageously reduce an amount of the photoresist resin consumed compared to forming the photoresist layer 128 by a spin-coat process, in which a majority of photoresist resin is spun off the wafer 101 and discarded. FIG. 1M through FIG. 1P are cross sections of the microelectronic device 100, depicted in stages of subsequent steps in the example method of formation.

Referring to FIG. 1M, the wafer 101 of this example may include a substrate 129, such as a semiconductor substrate, or a sapphire substrate. The wafer 101 may include bond pads 130, which are electrically conductive. The bond pads 130 may include, for example, aluminum or copper. The wafer 101 may further include a plating seed layer 131 on the substrate 129 and the bond pads 130. The plating seed layer 131 extends to the first surface 103 of the wafer 101. The plating seed layer 131 is electrically conductive, and makes electrical contact to the bond pads 130. The plating seed layer 131 may include, by way of example, an adhesion sublayer contacting the substrate 129 and the bond pads 130, an optional barrier sublayer on the adhesion sublayer, and a low resistance sublayer on the barrier sublayer. The adhesion sublayer may include titanium or tungsten, to provide desired adhesion of the plating seed layer 131 to the substrate 129 and the bond pads 130. The low resistance sublayer may include copper to provide a suitable surface for a subsequent plating process. The barrier sublayer, if present, may include nickel, cobalt, or molybdenum, to reduce diffusion of copper from the low resistance sublayer into the wafer 101.

The photoresist layer 128 contacts the plating seed layer 131. The photoresist layer 128 includes the first photoresist sublayer 112, the second photoresist sublayer 121, the third photoresist sublayer 124, and the fourth photoresist sublayer 126.

The wafer 101 is disposed in a photolithographic tool 132 which includes a light source 133 and an optical element 134, depicted in FIG. 1M as a lens 134. A photomask 135 is disposed in the photolithographic tool 132 in an optical path between the light source 133 and the optical element 134. The photomask 135 has light-blocking geometries 136 which have reduced transmission of UV light 137.

The UV light 137 is generated by the light source 133 and is incident on the photomask 135. A portion of the UV light 137 is transmitted through the photomask 135 in areas not blocked by the light-blocking geometries 136, and is incident on the optical element 134. The portion of the UV light 137 is focused onto the photoresist layer 128, exposing the photoresist resin in the first photoresist sublayer 112, the second photoresist sublayer 121, the third photoresist sublayer 124, and the fourth photoresist sublayer 126, in areas for bump bond pillars 138 over the bond pads 130. The photoresist resin exposed by the UV light 137 is converted from a cyclic ketone to a carboxylic acid.

Referring to FIG. 1N, a positive tone develop process using a developer solution 139 dissolves the photoresist layer 128 where exposed by the UV light 137 of FIG. 1M, that is, in the areas for the bump bond pillars 138. The developer solution 139 may include, for example, an alkaline aqueous solution of tetra methyl ammonium hydroxide (TMAH) or potassium hydroxide (KOH). The developer solution 139 does not remove a significant amount of the photoresist layer 128 which was not exposed by the UV light 137, leaving the photoresist layer 128 which was not exposed by the UV light 137 in place on the wafer. After the developer solution 139 dissolves the photoresist layer 128, the wafer 101 and the photoresist layer 128 are rinsed and dried.

In an alternate version of this example, using a negative tone photolithographic process, the develop process may dissolve the photoresist layer 128 where it was not exposed by the UV light 137, leaving the photoresist layer 128 which was exposed by the UV light 137 in place on the wafer.

Referring to FIG. 1O, a plating process using a plating bath 140 forms copper pillars 141 on the plating seed layer 131 in the areas for the bump bond pillars 138. The plating bath 140 includes copper ions which plate onto the plating seed layer 131 and the partially-formed copper pillars 141. The plating process may be implemented as an electroplating process or as an electroless plating process. After the copper pillars 141, the photoresist layer 128 is removed, exposing the plating seed layer 131. The photoresist layer 128 may be removed by any combination of a dry process using oxygen radicals and a wet process using organic solvents such as 1-methyl-2-pyrrolidone (NMP). After the photoresist layer 128 is removed, the plating seed layer 131 is removed where exposed by the copper pillars 141. The plating seed layer 131 may be removed by a wet etch process using one or more acidic aqueous solutions. Copper in the plating seed layer 131 may be removed using an aqueous solution of ferric chloride, for example. Titanium and tungsten in the plating seed layer 131 may be removed by an aqueous solution including nitric acid, or concentrated hydrogen peroxide, for example.

Referring to FIG. 1P, optional barrier layers 142 may be formed on the copper pillars 141, and solder bumps 143 may be formed on the barrier layers 142. The solder bumps 143 may include tin. For example, the solder bumps 143 may include a eutectic alloy of tin, copper, and silver. The barrier layers 142 may include nickel, cobalt, or molybdenum, to reduce diffusion of copper from the copper pillars 141 into the solder bumps 143, and to reduce diffusion of tin from the solder bumps 143 into the copper pillars 141. The barrier layers 142 may be formed by plating, for example. The solder bumps 143 may be formed by plating, or by dispensing solder paste onto the barrier layers 142, followed by heating the solder paste in a solder reflow process.

Figure 2A:
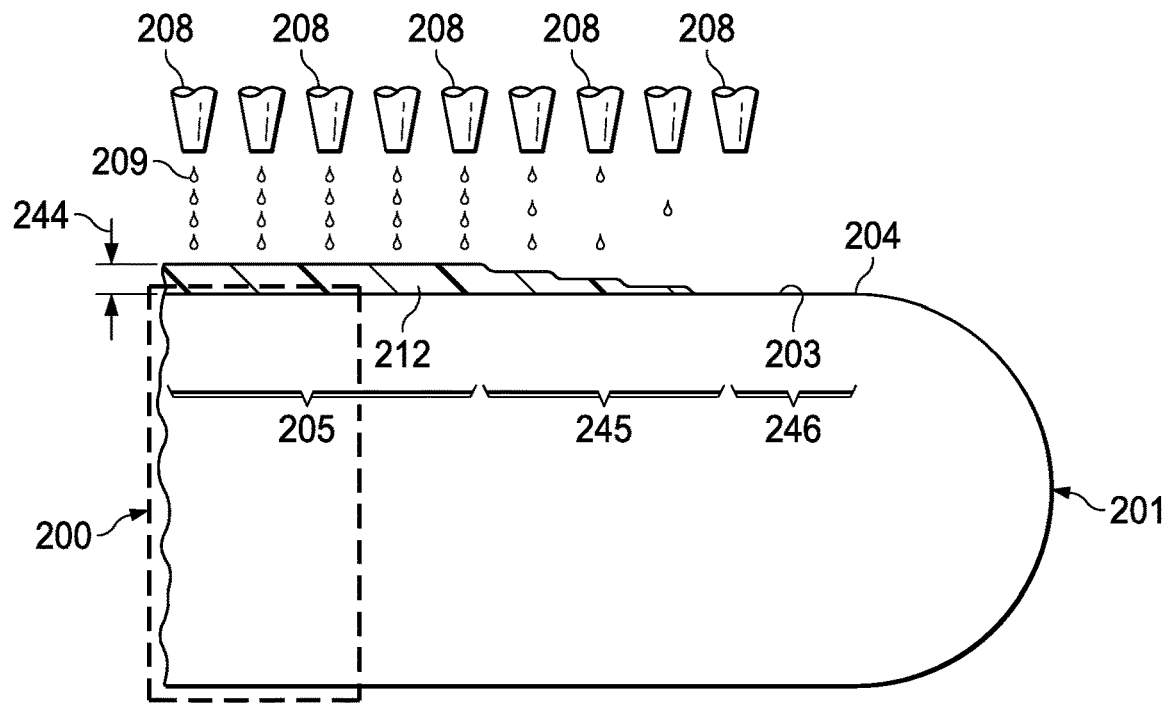
FIG. 2A through FIG. 2D are cross sections of a microelectronic device, depicted in stages of another example method of formation.

FIG. 2A through FIG. 2D are cross sections of a microelectronic device, depicted in stages of another example method of formation. Referring to FIG. 2A, the microelectronic device 200 is part of a wafer 201, which may contain additional microelectronic devices, not shown. The microelectronic device 200 may be implemented as any of the devices disclosed in reference to the microelectronic device 100 of FIG. 1A. The wafer 201 may be implemented as any of the wafer formats disclosed in reference to the wafer 101 of FIG. 1A. The wafer 201 has a first surface 203 which has a lateral perimeter 204 proximate to a lateral perimeter of the wafer 201. In this example, a coating area 205 of the first surface 203 extends over the microelectronic device 200 and the additional microelectronic devices, but does not extend to the lateral perimeter 204 of the first surface 203. The coating area 205 may extend to within 1 mm to 3 mm of the lateral perimeter 204, depending on the fabrication processes used to form the microelectronic device 200.

The wafer 201 is moved under droplet-on-demand sites 208. The droplet-on-demand sites 208 extend across a width that is at least as wide as the coating area 205. The droplet-on-demand sites 208 dispense discrete amounts of a mixture 209 of photoresist resin and solvents onto the wafer 201 to form a first photoresist sublayer 212 on the first surface 203, for example, as disclosed in reference to FIG. 1A through FIG. 1C. The first photoresist sublayer 212 is continuous and covers the coating area 205. A first as-coated thickness 244 of the first photoresist sublayer 212 over the coating area 205 has a non-uniformity less than 10 percent. The first as-coated thickness 244 may be 30 microns to 50 microns, before any solvents are removed from the first photoresist sublayer 212.

In this example, the discrete amounts of the mixture 209 of photoresist resin and solvents are dispensed at lower frequencies by the droplet-on-demand sites 208 between the coating area 205 and the lateral perimeter 204 of the first surface 203, compared to frequencies used by the droplet-on-demand sites 208 in the coating area 205, so that a thickness of the first photoresist sublayer 212 decreases from the first as-coated thickness 244 at a lateral perimeter of the coating area 205 to zero in a taper region 245, which extends from the lateral perimeter of the coating area 205 outward by a lateral distance of 100 microns to 1 mm. Furthermore, the first photoresist sublayer 212 does not extend into a wafer edge exposure (WEE) region 246 which extends inward from the lateral perimeter 204 of the first surface 203 by a lateral distance of 1 mm to 3 mm. FIG. 2A depicts the taper region 245 as wider than the WEE region 246, in order to more clearly depict a tapered profile of the first photoresist sublayer 212 in the taper region 245. The first photoresist sublayer 212 has the tapered profile in the taper region 245 as a result of the first photoresist sublayer 212 being formed by the discrete amounts of the mixture 209 of photoresist resin and solvents. The tapered profile in the taper region 245 may advantageously enable the mixture 209 of photoresist resin and solvents to coalesce due to surface tension, without forming an edge bead that is thicker than the first as-coated thickness 244. Adhesion of the first photoresist sublayer 212 to the wafer 201 in the taper region 245 resists contraction of the mixture 209 of photoresist resin and solvents due to surface tension, maintaining the thickness of the first photoresist sublayer 212 to be no greater than the first as-coated thickness 244. Forming the first photoresist sublayer 212 by abruptly terminating the dispensing of the mixture 209 of photoresist resin and solvents at the WEE region 246 may undesirably result in forming the edge bead. Edge beads interfere with photolithography processes and other fabrication processes used to form the microelectronic device 200.

Figure 2B:
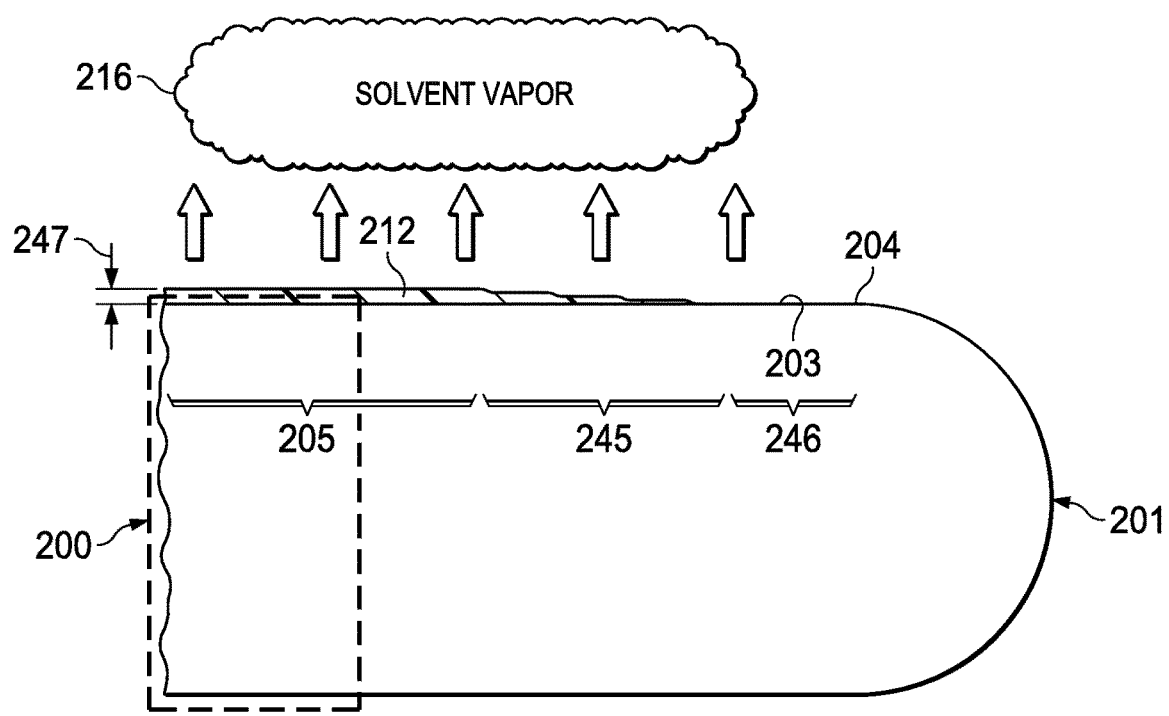

Referring to FIG. 2B, a portion of the solvents, in the form of solvent vapor 216, is removed from the first photoresist sublayer 212. The solvent vapor 216 may be removed by a process similar to the process disclosed in reference to FIG. 1D. Between 10 weight percent and 75 weight percent of the solvents in the first photoresist sublayer 212 may be removed, by way of example. The thickness of the first photoresist sublayer 212 in the coating area 205 may decrease according to the amount of solvents removed, to a first desolvated thickness 247. The thickness of the first photoresist sublayer 212 in the taper region 245 decreases to zero, so that the thickness of the first photoresist sublayer 212 in the taper region 245 does not exceed the first desolvated thickness 247. Furthermore, removal of the portion of the solvents from the first photoresist sublayer 212 is performed without sudden pressure or temperature changes, so that the first photoresist sublayer 212 does not extend into the WEE region 246.

Figure 2C:
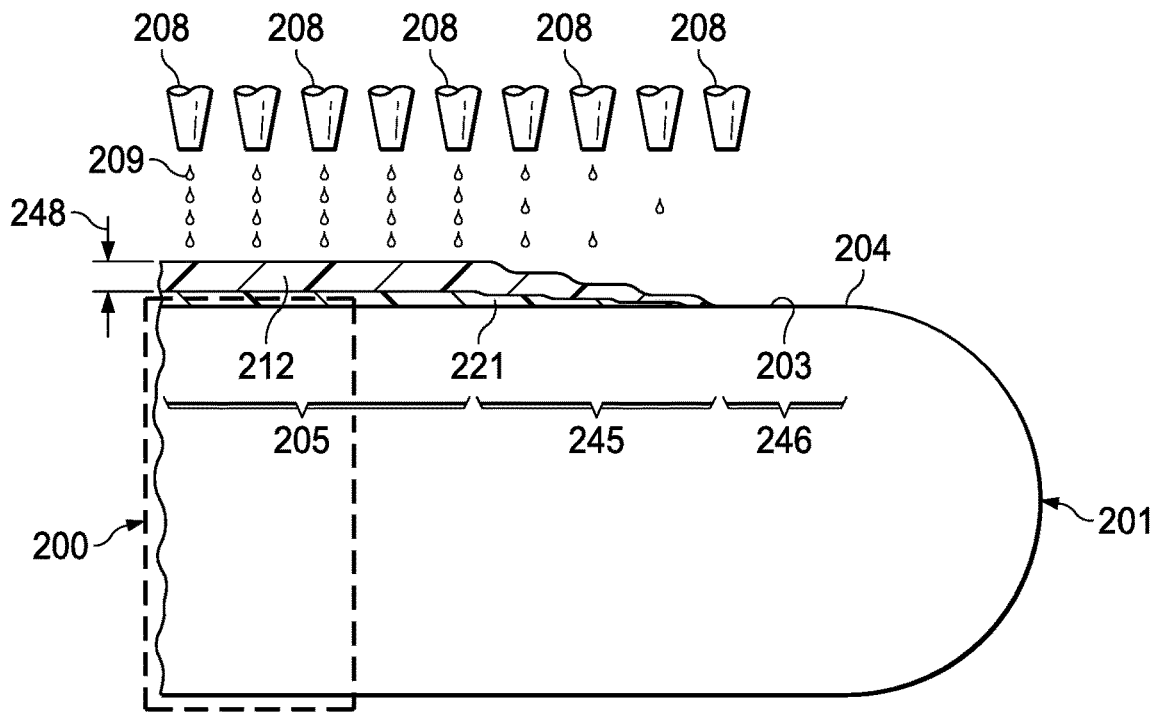

Referring to FIG. 2C, the wafer 201 is moved under the droplet-on-demand sites 208. The droplet-on-demand sites 208 dispense the discrete amounts of the mixture 209 of photoresist resin and solvents onto the wafer 201 to form a second photoresist sublayer 221 on the first photoresist sublayer 212, for example, as disclosed in reference to FIG. 1E through FIG. 1H. The second photoresist sublayer 221 is continuous and covers the coating area 205. A second as-coated thickness 248 of the second photoresist sublayer 221 over the coating area 205 has a non-uniformity less than 10 percent. The second as-coated thickness 248 may be 30 microns to 50 microns, before any solvents are removed from the second photoresist sublayer 221. The discrete amounts of the mixture 209 of photoresist resin and solvents are dispensed at lower frequencies by the droplet-on-demand sites 208 in the taper region 245, compared to the coating area 205, so that a thickness of the second photoresist sublayer 221 decreases from the second as-coated thickness 248 to zero, in the taper region 245. Furthermore, the second photoresist sublayer 221 does not extend into the WEE region 246 The second photoresist sublayer 221 has a tapered profile in the taper region 245, formed by a similar process as the tapered profile of the first photoresist sublayer 212. Adhesion of the second photoresist sublayer 221 to the first photoresist sublayer 212 and to the wafer 201, in the taper region 245, resists contraction of the mixture 209 of photoresist resin and solvents due to surface tension, maintaining the thickness of the second photoresist sublayer 221) to be no greater than the second as-coated thickness 248.

Figure 2D:
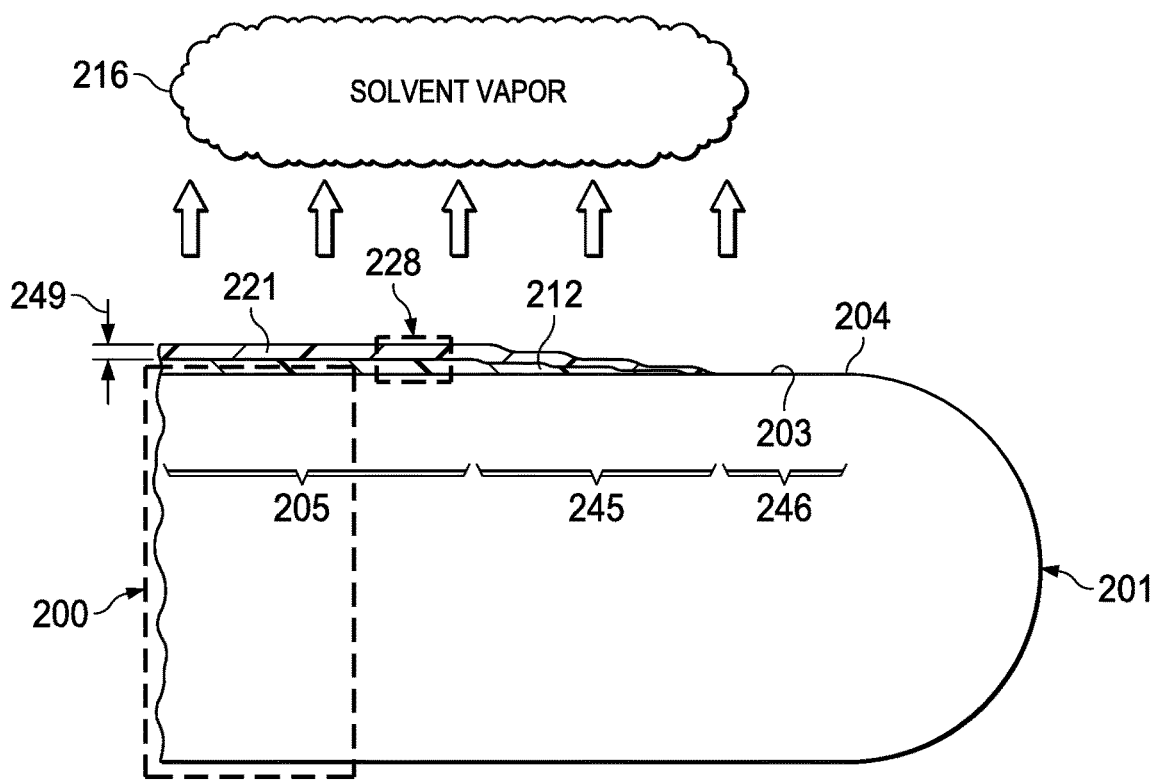

Referring to FIG. 2D, a portion of the solvents, in the form of solvent vapor 216, is removed from the second photoresist sublayer 221. The solvent vapor 216 may be removed by a process similar to the process disclosed in reference to FIG. 1D. Between 10 weight percent and 75 weight percent of the solvents in the second photoresist sublayer 221 may be removed, by way of example. The thickness of the second photoresist sublayer 221 in the coating area 205 may decrease according to the amount of solvents removed, to a second desolvated thickness 249. The thickness of the second photoresist sublayer 221 in the taper region 245 decreases to zero, so that the thickness of the second photoresist sublayer 221 in the taper region 245 does not exceed the second desolvated thickness 249. Furthermore, removal of the portion of the solvents from the second photoresist sublayer 221 is performed without sudden pressure or temperature changes, so that the second photoresist sublayer 221 does not extend into the WEE region 246.

The first photoresist sublayer 212 and the second photoresist sublayer 221 provide at least a portion of a photoresist layer 228 on the wafer 201. Additional photoresist sublayers of the photoresist layer 228 may be formed on the wafer 201, by methods similar to the methods disclosed in reference to FIG. 2A through FIG. 2D, so that a thickness of the photoresist layer 228 decreases to zero in the taper region 245, and the photoresist layer 228 does not extend into the WEE region 246. Forming the photoresist layer 228 using the method of this example may advantageously reduce fabrication cost and fabrication complexity of the microelectronic device 200 by eliminating a need for an edge bead removal process, as would be required if the photoresist layer 228 were formed by a spin-coat process.

Figure 3A:
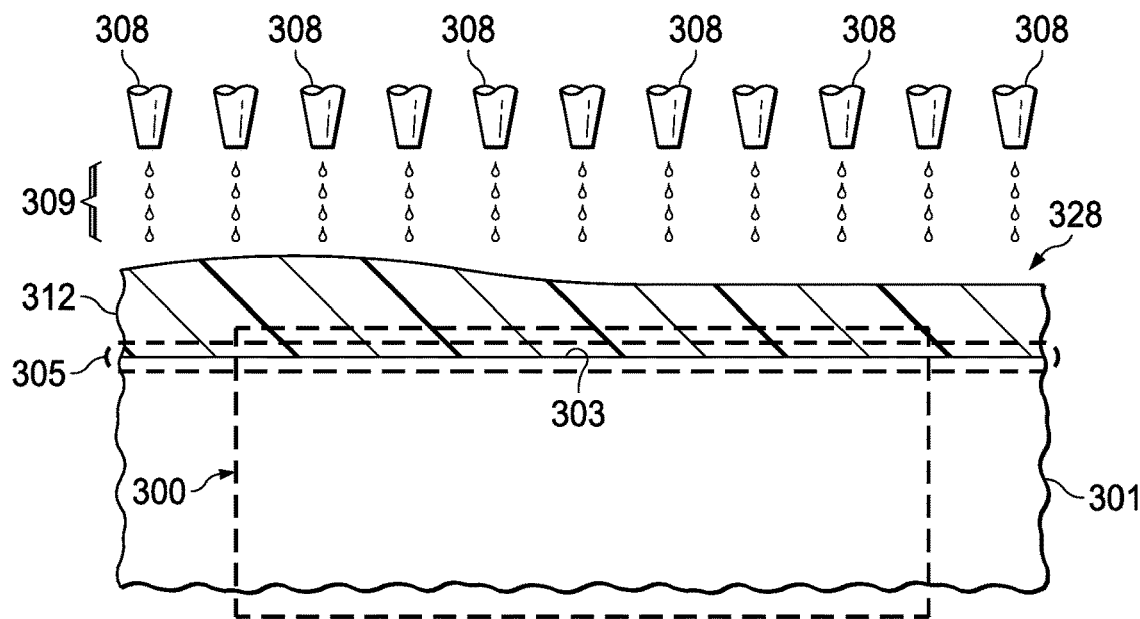
FIG. 3A through FIG. 3C are cross sections of a microelectronic device, depicted in stages of a further example method of formation.
Figure 3B:
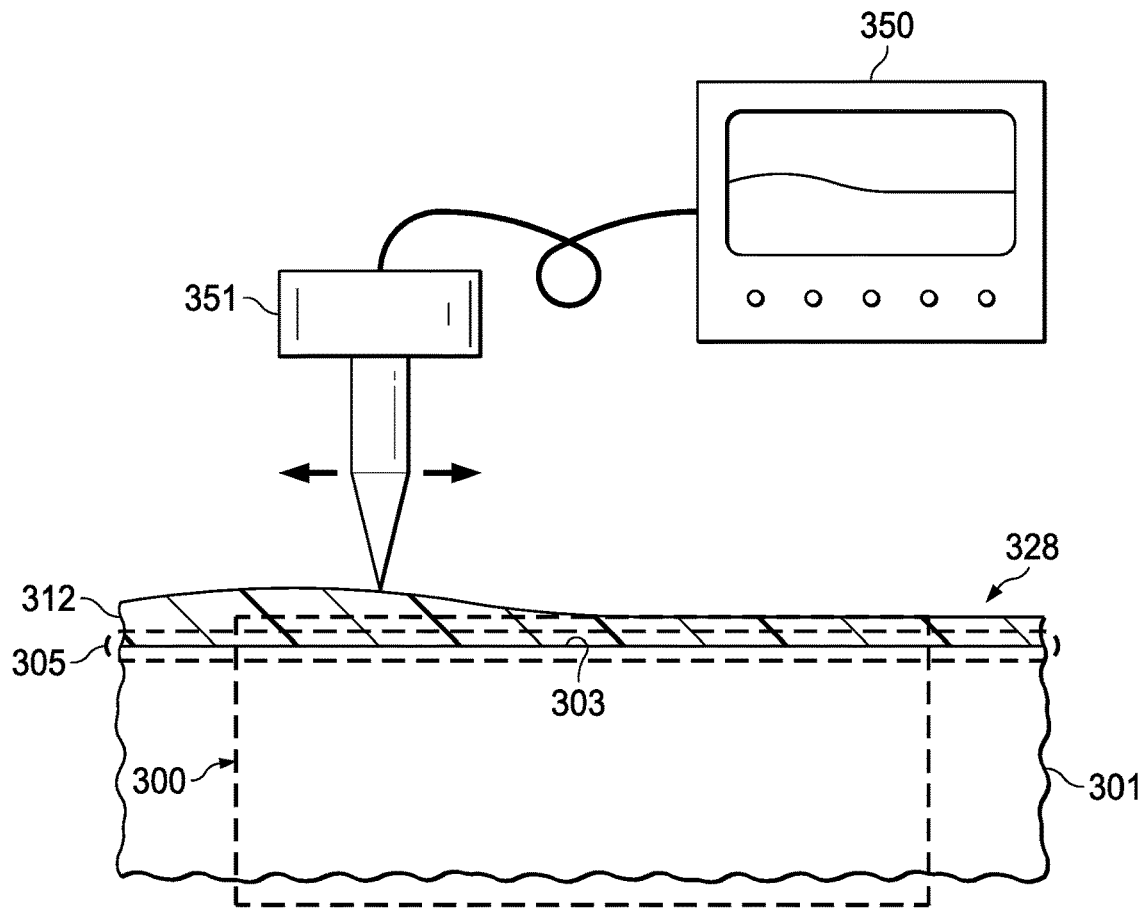
Figure 3C:
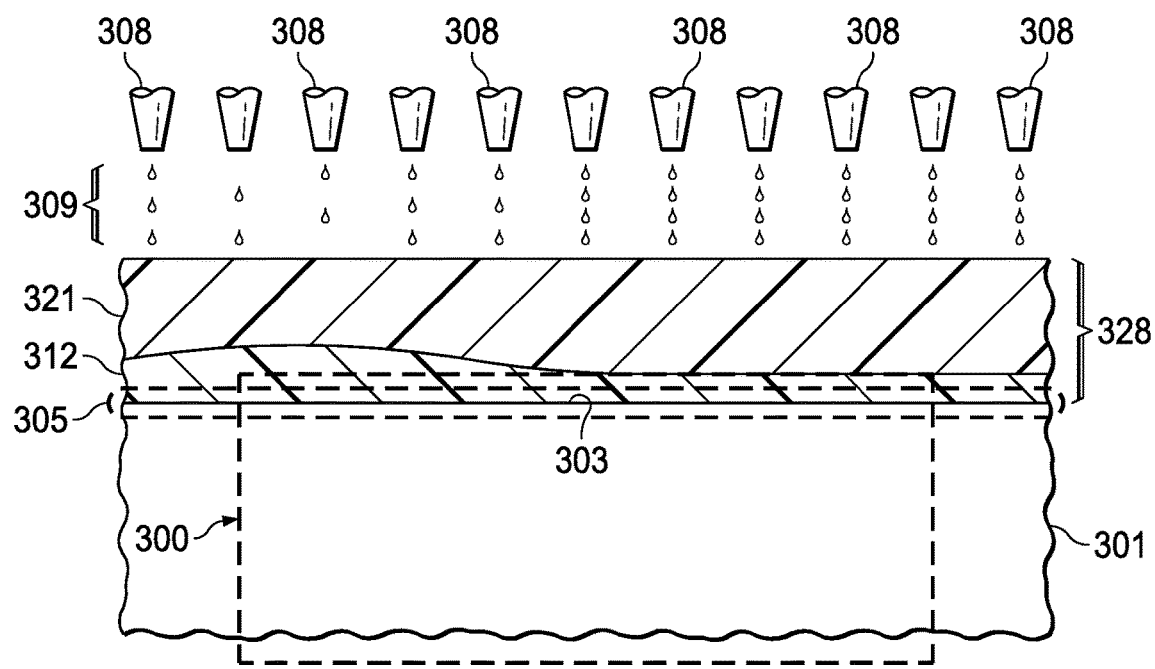

FIG. 3A through FIG. 3C are cross sections of a microelectronic device, depicted in stages of a further example method of formation. Referring to FIG. 3A, the microelectronic device 300 is part of a wafer 301, which may contain additional microelectronic devices, not shown. The microelectronic device 300 may be implemented as any of the devices disclosed in reference to the microelectronic device 100 of FIG. 1A. The wafer 301 may be implemented as any of the wafer formats disclosed in reference to the wafer 101 of FIG. 1A. The wafer 301 has a first surface 303 which extends to a lateral perimeter, not shown, of the wafer 301. In this example, a coating area 305 of the first surface 303 extends over the microelectronic device 300 and the additional microelectronic devices, but does not extend to the lateral perimeter of the wafer 301.

The wafer 301 is moved under droplet-on-demand sites 308, in a manner as disclosed in reference to FIG. 1A through FIG. 1C. The droplet-on-demand sites 308 extend across a width that is at least as wide as the coating area 305. The droplet-on-demand sites 308 dispense first discrete amounts of a mixture 309 of photoresist resin and solvents onto the wafer 301 to form a first photoresist sublayer 312 of a photoresist layer 328 on the first surface 303, for example, as disclosed in reference to FIG. 1A through FIG. 1C. The first photoresist sublayer 312 is continuous and covers the coating area 305. FIG. 3A depicts the first photoresist sublayer 312 immediately after the mixture 309 of photoresist resin and solvents are dispensed onto the wafer 301.

A portion of the solvents in the first photoresist sublayer 312 is removed, resulting in a decrease in thickness of the first photoresist sublayer 312. The portion of the solvents in the first photoresist sublayer 312 may be removed as disclosed in reference to FIG. 1D.

The first photoresist sublayer 312 may have an undesired level of thickness non-uniformity, which may be due to unintended variations in the process of dispensing the mixture 309 of photoresist resin and solvents from the droplet-on-demand sites 308, by way of example. One possible source of the unintended variations in the process of dispensing the mixture 309 may be variations in volumes of the droplets of the mixture 309.

Referring to FIG. 3B, thickness variations of the first photoresist sublayer 312 are measured. The thickness variations may be measured using a surface profilometer tool 350 with a scanning stylus 351, as depicted in FIG. 3B. Alternatively, the thickness variations may be measured using a non-contact optical tool, such as an optical interferometric tool, or a reflectometry tool. Other methods of measuring the thickness variations of the first photoresist sublayer 312 are within the scope of this example.

Referring to FIG. 3C, the wafer 301 is moved under droplet-on-demand sites 308, in a manner as disclosed in reference to FIG. 1E through FIG. 1H. The droplet-on-demand sites 308 dispense second discrete amounts of the mixture 309 of photoresist resin and solvents onto the wafer 301 to form a second photoresist sublayer 321 of the photoresist layer 328 on the first surface 303. In this example, dispensing of the second discrete amounts of the mixture 309 of photoresist resin and solvents is adjusted for each of the droplet-on-demand sites 308 to compensate for the thickness variations of the first photoresist sublayer 312, so that the photoresist layer 328 has a better thickness uniformity than the thickness uniformity of the first photoresist sublayer 312 alone. More of the mixture 309 may be dispensed in regions where the first photoresist sublayer 312 is thinner than an average thickness of the first photoresist sublayer 312, and less of the mixture 309 may be dispensed in regions where the first photoresist sublayer 312 is thicker than the average thickness. The dispensing of the second discrete amounts of the mixture 309 may be adjusted by adjusting the volumes of the droplets of the mixture 309, by adjusting the rate at which the droplets are dispensed, or by adjusting both the volumes of the droplets and the rate of dispensing the droplets. The second photoresist sublayer 321 is continuous and covers the coating area 305. FIG. 3C depicts the first photoresist sublayer 312 immediately after the mixture 309 of photoresist resin and solvents are dispensed onto the wafer 301. A portion of the solvents in the second photoresist sublayer 321 is removed, resulting in a decrease in thickness of the second photoresist sublayer 321.

Adjusting the droplets of the mixture 309 to compensate for the thickness variations of the first photoresist sublayer 312 may advantageously improve a thickness uniformity of the photoresist layer 328. Additional photoresist sublayers of the photoresist layer 328 may be formed over the combination of the first photoresist sublayer 312 and the second photoresist sublayer 321, and thickness variations of the photoresist layer 328 may be measured. Subsequent photoresist sublayers of the photoresist layer 328 may be formed by adjusting the droplets of the mixture 309 to compensate for the thickness variations of the photoresist layer 328, further accruing the advantage of advantageously improved thickness uniformity.

Figure 4:
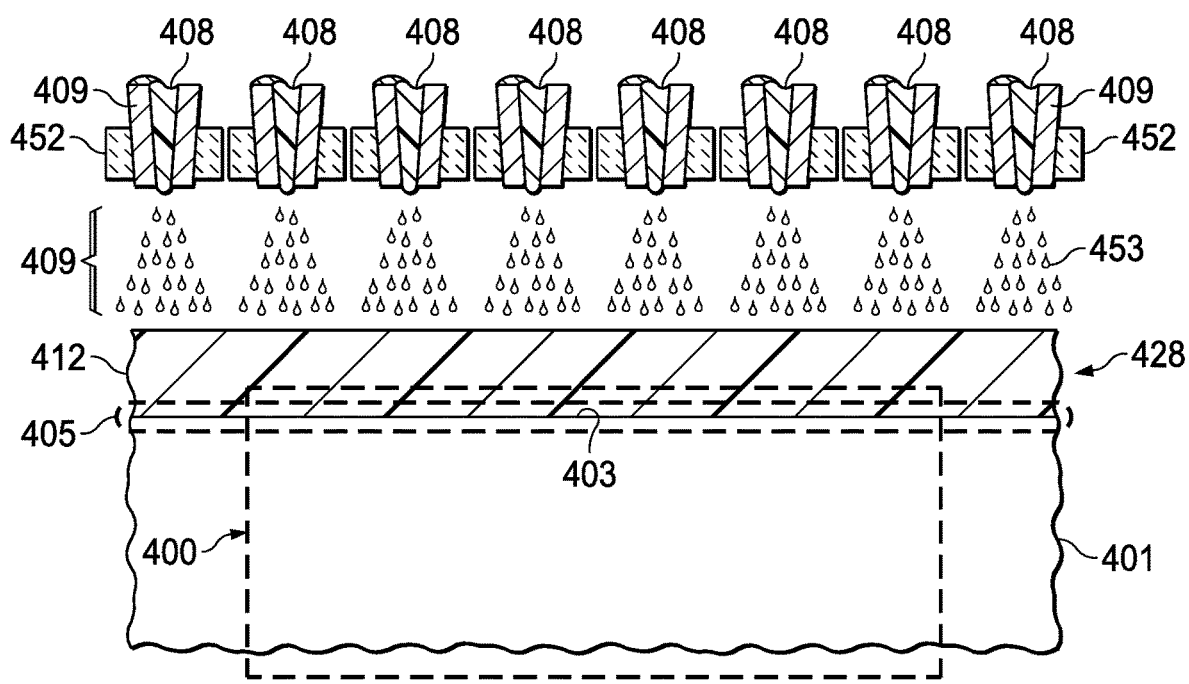
FIG. 4 is a cross section of a microelectronic device, depicted in another example method of formation.

FIG. 4 is a cross section of a microelectronic device, depicted in another example method of formation. The microelectronic device 400 is part of a wafer 401, which may contain additional microelectronic devices, not shown. The microelectronic device 400 may be implemented as any of the devices disclosed in reference to the microelectronic device 100 of FIG. 1A. The wafer 401 may be implemented as any of the wafer formats disclosed in reference to the wafer 101 of FIG. 1A. The wafer 401 has a first surface 403 which extends to a lateral perimeter, not shown, of the wafer 401. In this example, a coating area 405 of the first surface 403 extends over the microelectronic device 400 and the additional microelectronic devices, but does not extend to the lateral perimeter of the wafer 401.

The wafer 401 is moved under droplet-on-demand sites 408, in a manner as disclosed in reference to FIG. 1A through FIG. 1C. The droplet-on-demand sites 408 extend across a width that is at least as wide as the coating area 405. The droplet-on-demand sites 408 are configured to dispense first discrete amounts of a mixture 409 of photoresist resin and solvents. The droplet-on-demand sites 408 of this example include ultrasonic transducers 452 which apply ultrasonic energy to the discrete amounts of the mixture 409 to break up each of the discrete amounts of the mixture 409 into a plurality of small droplets 453. The discrete amounts of the mixture 409 may have volumes of 10 pL to 50 pL, while the small droplets 453 may have volumes of 1 percent to 10 percent of the volumes of the discrete amounts of the mixture 409. The droplet-on-demand sites 408 dispense the discrete amounts of the mixture 409, in the form of the small droplets 453, onto the wafer 401 to form a first photoresist sublayer 412 of a photoresist layer 428 on the first surface 403. The small droplets 453 may disperse spatially, as depicted in FIG. 4, compared to single droplets having the entire first discrete amounts of the mixture 409. The small droplets 453 may thus form the first photoresist sublayer 412 with a more uniform thickness compared to dispensing the mixture 409 in single droplets for each discrete amount of the mixture 409. The first photoresist sublayer 412 is continuous and covers the coating area 405. Additional photoresist sublayers of the photoresist layer 428 may be formed over the first photoresist sublayer 412 by a similar method, to provide a desired thickness for the photoresist layer 428.

Figure 5A:
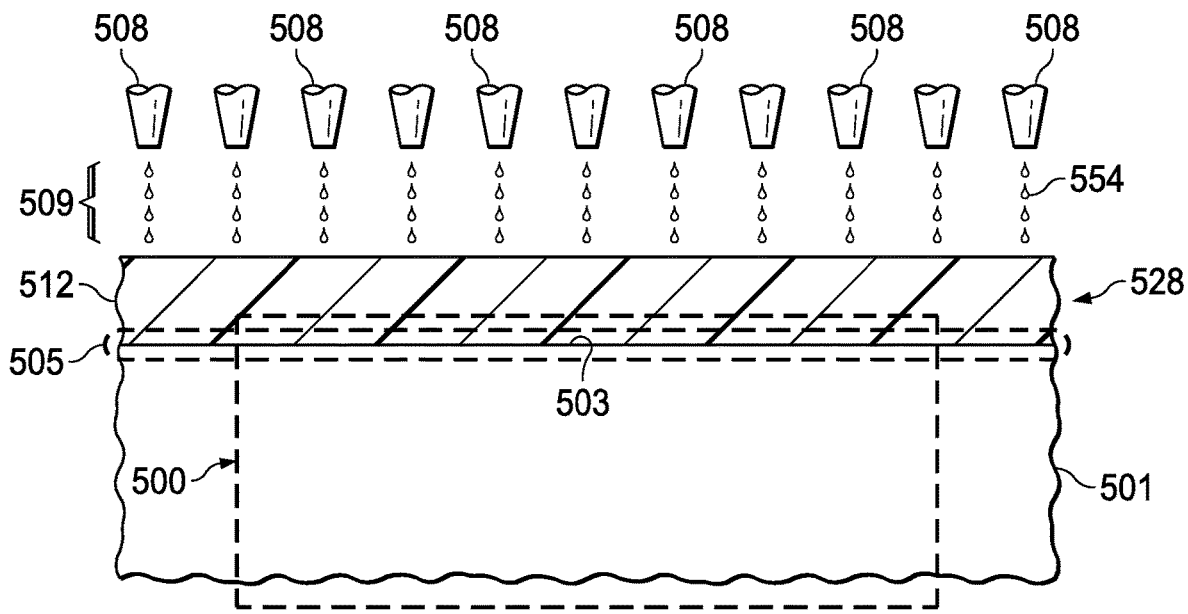
FIG. 5A and FIG. 5B are cross sections of a microelectronic device, depicted in stages of a further example method of formation.
Figure 5B:
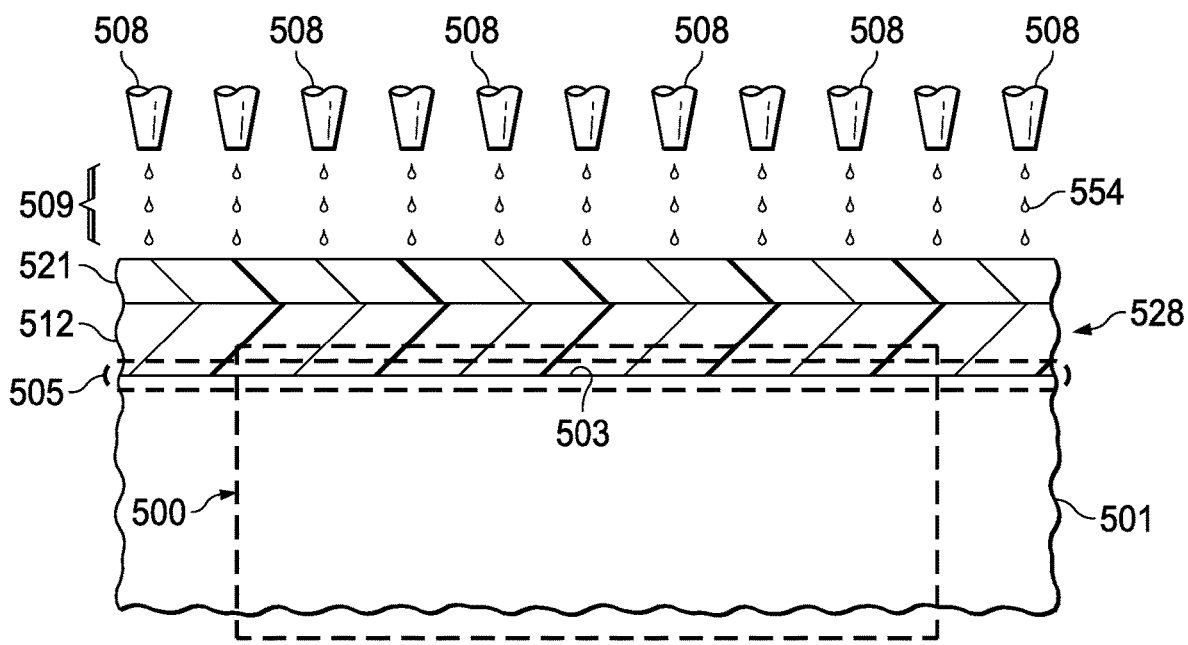

FIG. 5A and FIG. 5B are cross sections of a microelectronic device, depicted in stages of a further example method of formation. Referring to FIG. 5A, the microelectronic device 500 is part of a wafer 501, which may contain additional microelectronic devices, not shown. The microelectronic device 500 may be implemented as any of the devices disclosed in reference to the microelectronic device 100 of FIG. 1A. The wafer 501 may be implemented as any of the wafer formats disclosed in reference to the wafer 101 of FIG. 1A. The wafer 501 has a first surface 503 which extends to a lateral perimeter, not shown, of the wafer 501. In this example, a coating area 505 of the first surface 503 extends over the microelectronic device 500 and the additional microelectronic devices, but does not extend to the lateral perimeter of the wafer 501.

The wafer 501 is moved under droplet-on-demand sites 508 at a constant speed, in a manner as disclosed in reference to FIG. 1A through FIG. 1C. The droplet-on-demand sites 508 extend across a width that is at least as wide as the coating area 505. The droplet-on-demand sites 508 dispense discrete amounts of a mixture 509 of photoresist resin and solvents, in the form of droplets 554 which are dispensed at a first dispensing frequency, onto the wafer 501 to form a first photoresist sublayer 512 of a photoresist layer 528 on the first surface 503. The first photoresist sublayer 512 is continuous and covers the coating area 505. The first dispensing frequency may be selected so that the first photoresist sublayer 512 is formed with a sufficient thickness to prevent pooling and coalescing of the mixture 509 of photoresist resin and solvents on the wafer 501 while the droplets 554 are being dispensed. Dispensing the droplets 554 at a lower frequency may result in undesirable voids in the first photoresist sublayer 512.

After the droplets 554 are dispensed onto the wafer 501, a portion of the solvents in the first photoresist sublayer 512 is removed, resulting in a decrease in thickness of the first photoresist sublayer 512. The portion of the solvents in the first photoresist sublayer 512 may be removed as disclosed in reference to FIG. 1D.

Referring to FIG. 5B, the wafer 501 is moved under droplet-on-demand sites 508 at the constant speed, in a manner as disclosed in reference to FIG. 1E through FIG. 1H. The droplet-on-demand sites 508 dispense the discrete amounts of the mixture 509 of photoresist resin and solvents, in the form of the droplets 554 which are dispensed at a second dispensing frequency that is lower than the first dispensing frequency, onto the wafer 501 to form a second photoresist sublayer 521 of the photoresist layer 528 on the first photoresist sublayer 512. The second photoresist sublayer 521 is continuous and covers the coating area 505. After the droplets 554 are dispensed onto the wafer 501 to form the second photoresist sublayer 521, a portion of the solvents in the second photoresist sublayer 521 is removed, resulting in a decrease in thickness of the second photoresist sublayer 521. The second dispensing frequency may be selected so that the second photoresist sublayer 521 is formed with a thickness that is less than the thickness of the first photoresist sublayer 512, to provide a desired thickness of the photoresist layer 528. In an alternate version of this example, the second dispensing frequency may be greater than the first dispensing frequency, so that the thickness of the second photoresist sublayer 521 is greater than the thickness of the first photoresist sublayer 512.

Figure 6A:
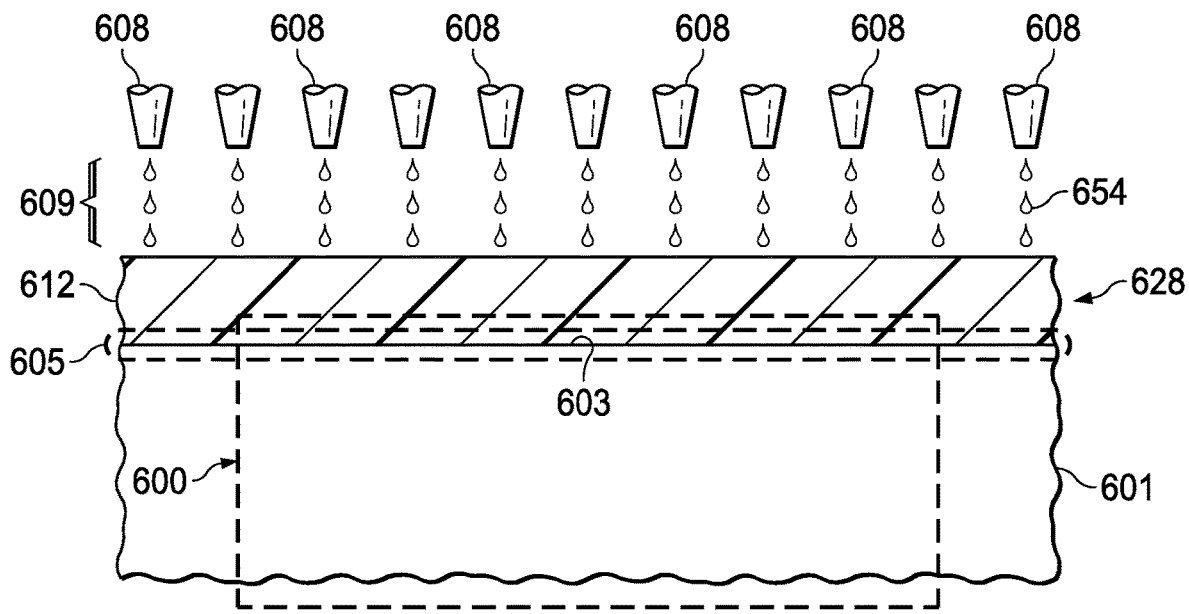
FIG. 6A and FIG. 6B are cross sections of a microelectronic device, depicted in stages of a further example method of formation.
Figure 6B:
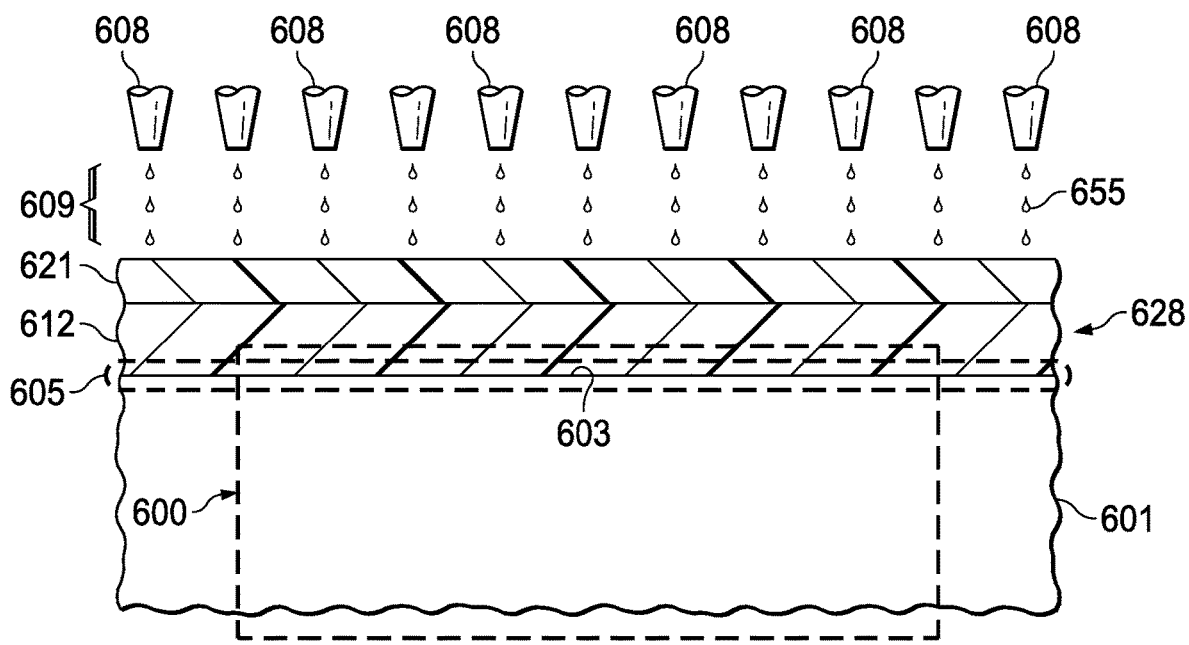

FIG. 6A and FIG. 6B are cross sections of a microelectronic device, depicted in stages of a further example method of formation. Referring to FIG. 6A, the microelectronic device 600 is part of a wafer 601, which may contain additional microelectronic devices, not shown. The microelectronic device 600 may be implemented as any of the devices disclosed in reference to the microelectronic device 100 of FIG. 1A. The wafer 601 may be implemented as any of the wafer formats disclosed in reference to the wafer 101 of FIG. 1A. The wafer 601 has a first surface 603 which extends to a lateral perimeter, not shown, of the wafer 601. In this example, a coating area 605 of the first surface 603 extends over the microelectronic device 600 and the additional microelectronic devices, but does not extend to the lateral perimeter of the wafer 601.

The wafer 601 is moved under droplet-on-demand sites 608 at a constant speed, in a manner as disclosed in reference to FIG. 1A through FIG. 1C. The droplet-on-demand sites 608 extend across a width that is at least as wide as the coating area 605. The droplet-on-demand sites 608 dispense first discrete amounts of a mixture 609 of photoresist resin and solvents, in the form of first droplets 654 at a constant frequency, onto the wafer 601 to form a first photoresist sublayer 612 of a photoresist layer 628 on the first surface 603. The first droplets 654 each have a first volume, which may be 10 pL to 50 pL, by way of example. The first photoresist sublayer 612 is continuous and covers the coating area 605. The first volume may be selected so that the first photoresist sublayer 612 is formed with a sufficient thickness to prevent pooling and coalescing of the mixture 609 of photoresist resin and solvents on the wafer 601 while the first droplets 654 are being dispensed. Dispensing the first droplets 654 at a lower volume may result in undesirable voids in the first photoresist sublayer 612.

After the first droplets 654 are dispensed onto the wafer 601, a portion of the solvents in the first photoresist sublayer 612 is removed, resulting in a decrease in thickness of the first photoresist sublayer 612. The portion of the solvents in the first photoresist sublayer 612 may be removed as disclosed in reference to FIG. 1D.

Referring to FIG. 6B, the wafer 601 is moved under droplet-on-demand sites 608 at the constant speed, in a manner as disclosed in reference to FIG. 1E through FIG. 1H. The droplet-on-demand sites 608 dispense second discrete amounts of the mixture 609 of photoresist resin and solvents, in the form of the second droplets 655 at the constant frequency, onto the wafer 601 to form a second photoresist sublayer 621 of the photoresist layer 628 on the first sublayer 612. The second droplets 655 each have a second volume, which is less than the first volume. The second photoresist sublayer 621 is continuous and covers the coating area 605. After the second droplets 655 are dispensed onto the wafer 601 to form the second photoresist sublayer 621, a portion of the solvents in the second photoresist sublayer 621 is removed, resulting in a decrease in thickness of the second photoresist sublayer 621. The second volume may be selected so that the second photoresist sublayer 621 is formed with a thickness that is less than the thickness of the first photoresist sublayer 612, to provide a desired thickness of the photoresist layer 628. In an alternate version of this example, the second volume may be greater than the first volume, so that the thickness of the second photoresist sublayer 621 is greater than the thickness of the first photoresist sublayer 612.

Figure 7A:
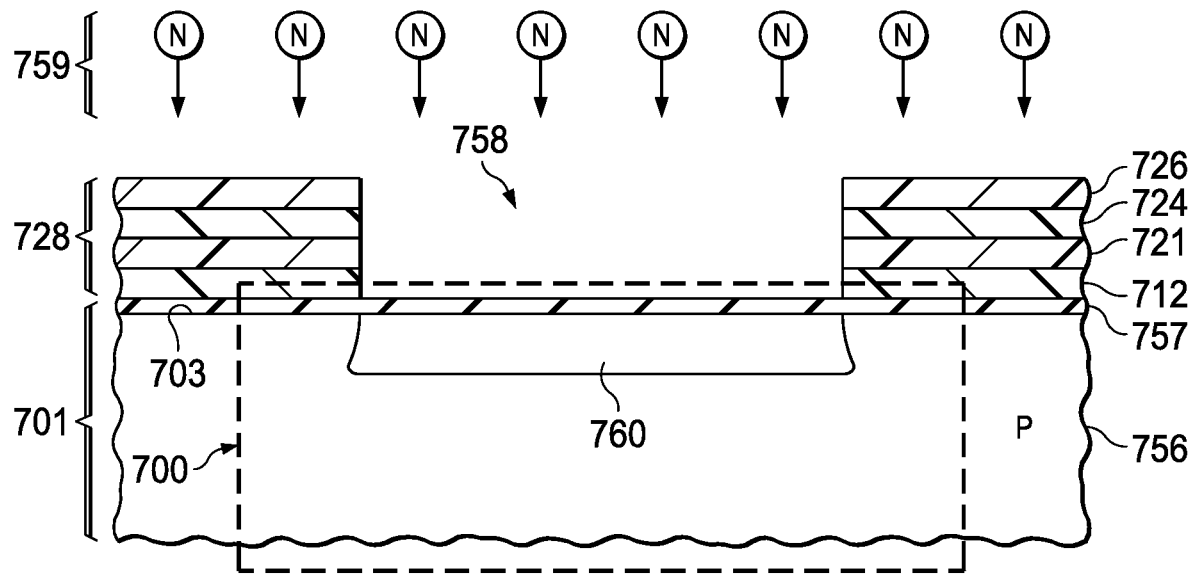
FIG. 7A and FIG. 7B are cross sections of a microelectronic device, depicted in stages of a further example method of formation.
Figure 7B:
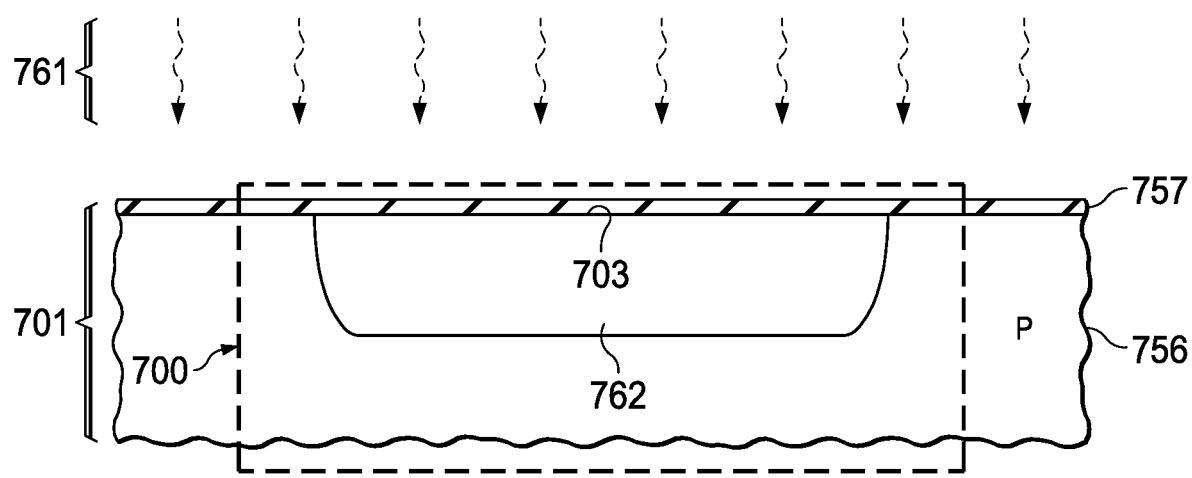

FIG. 7A and FIG. 7B are cross sections of a microelectronic device, depicted in stages of a further example method of formation. Referring to FIG. 7A, the microelectronic device 700 is part of a wafer 701, which may contain additional microelectronic devices, not shown. The microelectronic device 700 may be implemented as any of the devices disclosed in reference to the microelectronic device 100 of FIG. 1A. The wafer 701 may be implemented as any of the wafer formats disclosed in reference to the wafer 101 of FIG. 1A. In this example, the wafer 701 includes a semiconductor material 756, such as silicon. The semiconductor material 756 may be p-type, as indicated in FIG. 7A. The wafer 701 of this example further includes a dielectric layer 757 on the semiconductor material 756. The dielectric layer 757 extends to a first surface 703 of the wafer 701. By way of example, the dielectric layer 757 may include silicon dioxide, may have a thickness of 5 nanometer to 100 nanometers, and may be formed by thermal oxidation of the semiconductor material 756. The dielectric layer 757 is sometimes referred to as a pad oxide layer or sacrificial oxide layer. The purpose of the dielectric layer 757 is to protect the semiconductor material 756 from damage and contamination during fabrication processes.

A photoresist layer 728 is formed over the wafer 701, according to any of the examples disclosed herein. The photoresist layer 728 includes at least two photoresist sublayers; the photoresist layer 728 of this example includes a first photoresist sublayer 712 formed on the wafer 701, a second photoresist sublayer 721 formed on the first photoresist sublayer 712, a third photoresist sublayer 724 formed on the second photoresist sublayer 721, and a fourth photoresist sublayer 726 formed on the third photoresist sublayer 724. The photoresist layer 728 is patterned to expose the wafer 701 in an implant area 758. The photoresist layer 728 may be patterned as disclosed in reference to FIG. 1M and FIG. 1N, or by another patterning method.

Dopants 759 are implanted into the semiconductor material 756 where exposed by the photoresist layer 728, to form an implanted region 760 in the semiconductor material 756. The dopants 759 are blocked from the wafer 701 outside of the implanted region 760 by the photoresist layer 728. The dopants 759 may be n-type dopants, as indicated in FIG. 7A, such as phosphorus, arsenic, or antimony. In alternate versions of this example, the semiconductor material 756 may be n-type, or the dopants 759 may be p-type dopants, such as boron, gallium, or indium. Forming the photoresist layer 728 by any of the examples disclosed herein may accrue the advantages disclosed, such as reducing an amount of a mixture of photoresist resin and solvents used, compared to a spin-coat process, and eliminating a need to remove an edge bead from a perimeter of the wafer 701.

After the dopants 759 are implanted into the semiconductor material 756, the photoresist layer 728 is removed. The photoresist layer 728 may be removed by exposing the photoresist layer 728 to oxygen radicals in an asher process, followed by a wet etch process using an aqueous mixture of sulfuric acid and hydrogen peroxide. Other processes for removing the photoresist layer 728, such as wet processes using NMP, are within the scope of this example. The dielectric layer 757 may advantageously protect the semiconductor material 756 during removal of the photoresist layer 728.

Referring to FIG. 7B, the wafer 701 is heated by an anneal process 761 which activates the implanted dopants 759 of FIG. 7A in the implanted region 760 of FIG. 7A, to form an n-type region 762 in the semiconductor material 756. The anneal process 761 may be implemented as a furnace anneal, in which case the implanted dopants 759 may diffuse further into the semiconductor material 756. Alternatively, the anneal process 761 may be implemented as a rapid thermal anneal process, such as a spike anneal or a flash anneal.

Figure 8A:
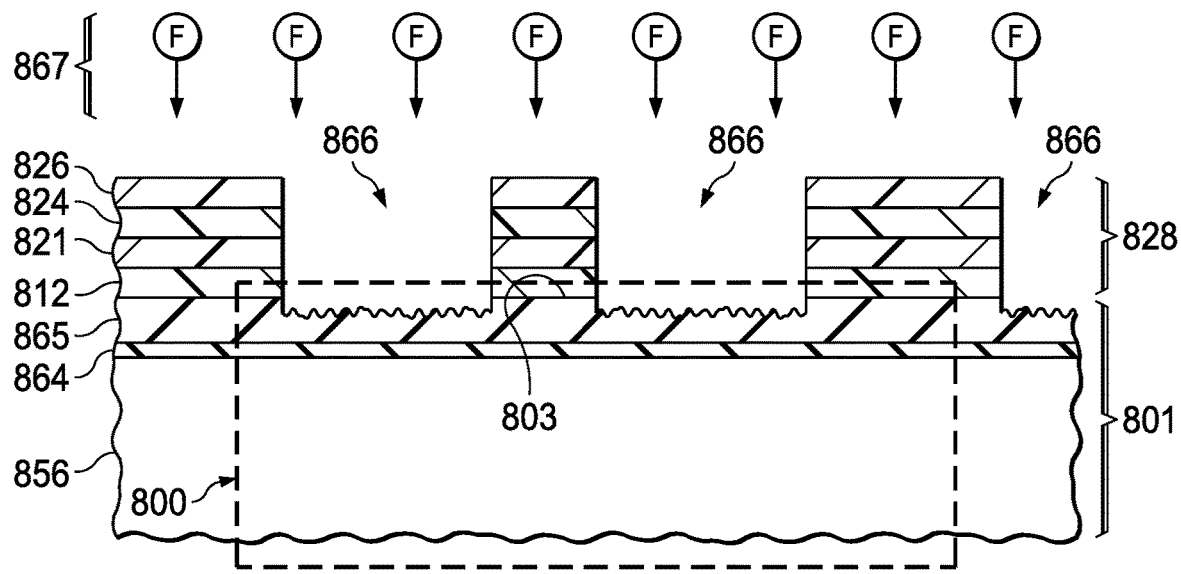
FIG. 8A and FIG. 8B are cross sections of a microelectronic device, depicted in stages of another example method of formation.
Figure 8B:
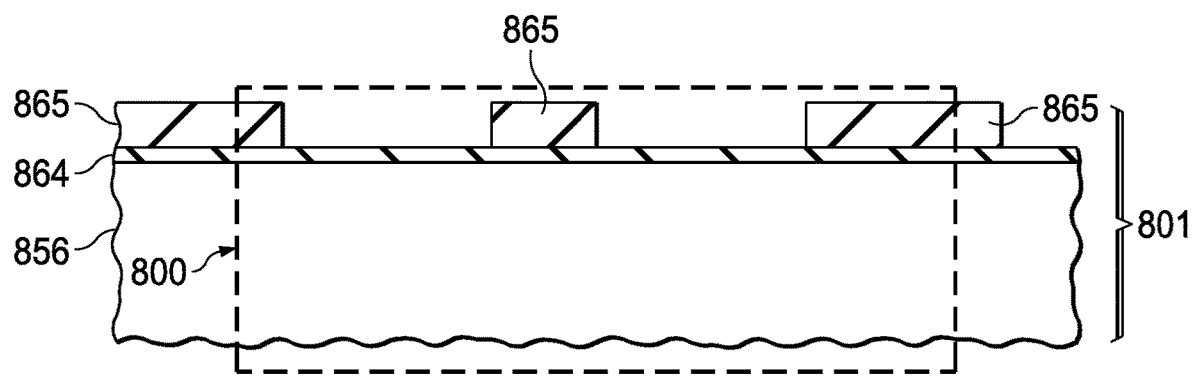

FIG. 8A and FIG. 8B are cross sections of a microelectronic device, depicted in stages of another example method of formation. Referring to FIG. 8A, the microelectronic device 800 is part of a wafer 801, which may contain additional microelectronic devices, not shown. The microelectronic device 800 may be implemented as any of the devices disclosed in reference to the microelectronic device 100 of FIG. 1A. The wafer 801 may be implemented as any of the wafer formats disclosed in reference to the wafer 101 of FIG. 1A. In this example, the wafer 801 includes a substrate 863, which may be implemented as partially fabricated devices, and may include semiconductor material, metal conductors, and dielectric layers. The wafer 801 of this example also includes an etch stop layer 864 on the substrate 863. The etch stop layer 864 may include silicon dioxide, silicon nitride, silicon oxynitride, silicon carbide, silicon carbonitride, or silicon oxycarbonitride, by way of example. The wafer 801 of this example further includes a material layer 865 on the etch stop layer 864. The material layer 865 extends to a first surface 803 of the wafer 801. The material layer 865 may include any material that provides a structure element of the microelectronic device 800, such as aluminum, polycrystalline silicon, silicon dioxide, or a dielectric material having a dielectric constant lower than silicon dioxide, sometimes referred to as a low-k dielectric material. The etch stop layer 864 has a composition that provides etch selectivity with respect to the material layer 865.

A photoresist layer 828 is formed over the wafer 801, according to any of the examples disclosed herein. The photoresist layer 828 includes at least two photoresist sublayers; the photoresist layer 828 of this example includes a first photoresist sublayer 812 formed on the wafer 801, a second photoresist sublayer 821 formed on the first photoresist sublayer 812, a third photoresist sublayer 824 formed on the second photoresist sublayer 821, and a fourth photoresist sublayer 826 formed on the third photoresist sublayer 824. The photoresist layer 828 is patterned to expose the wafer 801 in etch areas 866. The photoresist layer 828 may be patterned as disclosed in reference to FIG. 1M and FIG. 1N, or by another patterning method. Forming the photoresist layer 828 by any of the examples disclosed herein may accrue the advantages disclosed herein.

The material layer 865 is removed in the etch areas 866 by etchants 867 of a reactive ion etch (RIE) process. The etchants 867 may include halogen ions such as fluorine ions, as indicated in FIG. 8A, or may include other etchants. The photoresist layer 828 prevents the etchants 867 from attacking the material layer 865 outside of the etch areas 866. FIG. 8A depicts removal of the material layer 865 in the etch areas 866 partway to completion. The RIE process is continued until all the material layer 865 is removed in the etch areas 866. The etch stop layer 864 has a sufficiently low etch rate that the RIE process can be stopped before the etch stop layer 864 is removed in the etch areas 866. In an alternate version of this example, the material layer 865 may be removed in the etch areas 866 by a wet etch process.

After the material layer 865 is removed in the etch areas 866, the photoresist layer 828 is removed. The photoresist layer 828 may be removed by exposing the photoresist layer 828 to oxygen radicals in an asher process, followed by a wet etch process using an aqueous mixture of ammonium hydroxide and hydrogen peroxide. Other processes for removing the photoresist layer 828, such as wet processes using NMP, are within the scope of this example. FIG. 8B depicts the microelectronic device 800 after the photoresist layer 828 is removed.

Various features of the examples disclosed herein may be combined in other implementations of example methods of forming microelectronic devices. For example, any of the methods may be used to form a photoresist layer having two, three, four, or more photoresist sublayers. Any of the photoresist layers may be formed to have decreasing thickness in a taper zone that extends inward of a WEE region around a lateral perimeter of the wafer. Any of the photoresist layers may be formed by varying frequencies or volumes of droplets of the mixture of photoresist resin and solvents. Any of the photoresist layers may be formed by using ultrasonic to break up the discrete amounts of the mixture of photoresist resin and solvents into a plurality of small droplets. Any of the photoresist layers may be formed by measuring thickness variations after forming one or more photoresist sublayers, and adjusting dispensation of the mixture of photoresist resin and solvents during formation of a subsequent photoresist sublayer to compensate for the thickness variations. Moreover, the photoresist layers may be used for other processes besides plating masks, implant mask, and etch masks, in fabrication of the microelectronic devices.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments.

Rather, the scope of the disclosure should be defined in accordance with the following claims and their equivalents.

What is claimed is:

1. A method of forming a microelectronic device, comprising:
    providing a wafer having a first surface with a lateral perimeter, wherein lateral refers to a direction parallel to the first surface, wherein the first surface does not extend onto a curved surface of the wafer, the first surface having a coating area that does not extend to the lateral perimeter;
    providing droplet-on-demand sites configured to dispense droplets of a mixture of photoresist resin and solvents onto the wafer, the mixture having a viscosity of 2 centipoise (cp) to 20 cp and having a photoresist resin content of 10 weight percent to 20 weight percent, and the mixture including propylene glycol methyl ether acetate (PGMEA) and gamma butyrolactone (GBL);
    heating the wafer to a temperature in a first temperature range;
    moving the wafer under the droplet-on-demand sites in a first direction while the wafer is in the first temperature range, and dispensing first discrete amounts of the mixture of photoresist resin and solvents from the droplet-on-demand sites onto the wafer to form a first photoresist sublayer of a photoresist layer on the wafer, the first photoresist sublayer being continuous, the first photoresist sublayer covering the coating area;
    removing a portion of the solvents from the first photoresist sublayer while the wafer is in the first temperature range, after dispensing the first discrete amounts of the mixture of photoresist resin and solvents; and
    after removing the portion of the solvents from the first photoresist sublayer, moving the wafer under the droplet-on-demand sites in a second direction that is opposite from the first direction while the wafer is in a second temperature range, and dispensing second discrete amounts of the mixture of photoresist resin and solvents from the droplet-on-demand sites onto the wafer to form a second photoresist sublayer of the photoresist layer on the first photoresist sublayer, the second photoresist sublayer being continuous, the second photoresist sublayer covering the coating area.

2. The method of claim 1, wherein after the first discrete amounts of the mixture of photoresist resin and solvents are dispensed onto the wafer, the wafer is slowed to a stop at a deceleration rate which does not exceed 500 millimeters/second$^2$ (mm/s$^2$).

3. The method of claim 1, wherein the first discrete amounts of the mixture of photoresist resin and solvents each have a volume of 10 picoliters (pL) to 50 pL, and the second discrete amounts of the mixture of photoresist resin and solvents each have a volume of 10 pL to 50 pL.

4. The method of claim 1, wherein the first temperature range is 45° C. to 50° C., and the second temperature range is 45° C. to 50° C.

5. The method of claim 1, wherein the first photoresist sublayer is formed to have a thickness that decreases from a first thickness at a lateral perimeter of the coating area to zero in a taper region which extends from the coating area outward by a lateral distance of 100 microns to 1 mm, wherein the first photoresist sublayer does not extend into a wafer edge exposure (WEE) region that extends inward from the lateral perimeter of the first surface by a lateral distance of 1 mm to 3 mm.

6. The method of claim 1, wherein the mixture of photoresist resin and solvents has a surface tension of 20 dynes/centimeter (dynes/cm) to 50 dynes/cm, at 20° C. to 25° C., as measured by a dynamic surface tension measurement method.

7. The method of claim 1, further comprising introducing an anti-drying vapor over the wafer while the droplet-on-demand sites are dispensing the mixture of the photoresist resin and the solvents onto the wafer to form the first photoresist sublayer.

8. The method of claim 6, further comprising:
    after forming the first photoresist sublayer and before forming the second photoresist sublayer, moving the wafer laterally, in a direction perpendicular to the first direction, by a first lateral distance that is less than a lateral separation between adjacent droplet-on-demand sites.

9. The method of claim 1, further comprising measuring thickness variations of the first photoresist sublayer before forming the second photoresist sublayer.

10. The method of claim 9, wherein dispensing the second discrete amounts of the mixture of photoresist resin and solvents is adjusted to compensate for the thickness variations.

11. The method of claim 1, including applying ultrasonic energy to the first discrete amounts of the mixture of the photoresist resin and the solvents to break up each of the first discrete amounts into small droplets.

12. The method of claim 1, wherein the first discrete amounts of the mixture of photoresist resin and solvents are dispensed at a first dispensing frequency, and the second discrete amounts of the mixture of photoresist resin and solvents are dispensed at a second dispensing frequency, the second dispensing frequency being different from the first dispensing frequency.

13. The method of claim 1, wherein the first discrete amounts of the mixture of photoresist resin and solvents each have a first volume, and the second discrete amounts of the mixture of photoresist resin and solvents each have a second volume, the second volume being different from the first volume.

14. The method of claim 1, further comprising:
    exposing regions of the photoresist layer to ultraviolet (UV) light through a photomask; and
    dissolving the regions of the photoresist layer that were exposed to the UV light in a developer solution, leaving the photoresist layer that was not exposed to the UV light in place on the wafer.

15. The method of claim 1, further comprising:
    exposing regions of the photoresist layer to UV light through a photomask; and
    dissolving the regions of the photoresist layer that were not exposed to the UV light in a developer solution, leaving the photoresist layer that was exposed to the UV light in place on the wafer.

16. The method of claim 1, further comprising:
    patterning the photoresist layer using a photolithographic process; and
    plating copper pillars on the wafer in areas exposed by the photoresist layer.

17. The method of claim 1, further comprising:
    patterning the photoresist layer using a photolithographic process; and
    implanting dopants into the wafer in areas exposed by the photoresist layer.

18. The method of claim 1, further comprising:

patterning the photoresist layer using a photolithographic process; and etching a material layer of the wafer in areas exposed by the photoresist layer.

19. The method of claim 1, further comprising:

after dispensing the second discrete amounts of the mixture of photoresist resin and solvents, removing a portion of the solvents from the second photoresist sublayer while the wafer is in the second temperature range;

after removing the portion of the solvents from the second photoresist sublayer, moving the wafer under the droplet-on-demand sites in the first direction while the wafer is in a third temperature range, the third temperature range being equal to the second temperature range or the first temperature range, and dispensing third discrete amounts of the mixture of photoresist resin and solvents from the droplet-on-demand sites onto the wafer to form a third photoresist sublayer of the photoresist layer on the second photoresist sublayer, the third photoresist sublayer being continuous, the third photoresist sublayer covering the coating area.

* * * * *